United States Patent [19]
Tomizawa et al.

[11] Patent Number: 5,574,717
[45] Date of Patent: Nov. 12, 1996

[54] LINE TERMINATING EQUIPMENT IN SDH NETWORKS, USING FORWARD ERROR CORRECTING CODES

[75] Inventors: Masahito Tomizawa, Yokosuka; Yoshiaki Yamabayashi, Yokohama; Yukio Kobayashi; Kiyoshi Nakagawa, both of Miura-gun; Ken-ichi Yagisawa, Yokosuka, all of Japan

[73] Assignee: Nippon Telegraph and Telephone Corporation, Tokyo, Japan

[21] Appl. No.: 442,145

[22] Filed: May 16, 1995

[30] Foreign Application Priority Data

| May 17, 1994 | [JP] | Japan | 6-103110 |
| Mar. 20, 1995 | [JP] | Japan | 7-061380 |
| Apr. 4, 1995 | [JP] | Japan | 7-079034 |

[51] Int. Cl.$^6$ .................................................. H04L 1/00
[52] U.S. Cl. .......................... 370/13; 341/94; 371/37.1
[58] Field of Search ........................ 370/13, 13.1, 16, 370/17, 110.1; 371/37.1, 37.7, 37.8; 341/94; 359/110

[56] References Cited

U.S. PATENT DOCUMENTS

| 4,397,022 | 8/1983 | Weng et al. | 371/37.1 |
| 4,723,244 | 2/1988 | Iacoponi | 371/37.1 |
| 5,010,554 | 4/1991 | Bechtel et al. | 371/37.1 |
| 5,144,304 | 9/1992 | McMahon et al. | 341/94 |

FOREIGN PATENT DOCUMENTS

| 52-86011 | 7/1977 | Japan. |
| 6-29956 | 2/1994 | Japan. |

OTHER PUBLICATIONS

V. Paxal et al., "Error–Correction Coding for High–Speed Optical Transmission Systems Based on the Synchronous Digital Hierachy," European Transactions on Telecommunications, vol. 4, No. 6, Nov.–Dec. 1993 pp. 623–628.

P. M. Gabla et al., "401 km, 622 Mb/s and 357 km, 2.488 Gb/s IM/DD Repeaterless Transmission Experiments Using Erbium–Doped Fiber Amplifiers and Error Correcting Code," IEEE, Photonics Technology Letters, Oct. 1992, vol. 4, No. 10, pp. 1148–1151.

K. Aoyama et al., "Design and Operation of Transmission Lines Containing Er–Doped Fiber Amplifier Repeaters," IEEE 1992, pp. 1875–1879.

P. Moro et al., "565 Mb/s Optical Transmission System for Repeaterless Sections up to 200 Km," IEEE 1991, pp. 1217–1221.

W. D. Grover et al., "Design and Characterization of an Error–Correcting Code for the SONET STS–1 Tributary," IEEE Transactions on Communications, vol. 38, No. 4, Apr. 1990, pp. 467–477.

*Primary Examiner*—Melvin Marcelo
*Attorney, Agent, or Firm*—Finnegan, Henderson, Farabow, Garrett & Dunner, L.L.P.

[57] ABSTRACT

In an optical transmission system applicable to a SDH network, communication between two line terminating equipments is performed in a form of a STM frame composed of a SOH field and a payload, which is determined by CCITT recommendations. The line terminating equipment provides a FEC circuit which is preferably arranged at a location between MSP and MST function blocks. The FEC circuit is designed to perform coding/decoding operations, using a cyclic Hamming code, directly on each AU-4 message derived from the STM frame. Otherwise, the FEC circuit performs operations on each k-bit interleaved AU-4 message (where 'k' is an integer larger than 1). Check bits generated by a FEC coding circuit are written into undefined byte areas in a MSOH field, and error correcting is performed at a decoder circuit on the basis of embedded check bits, therefore FEC operations are performed within a multiplex-section layer. A FEC processing circuit is constituted by shift registers each of which is connected by exclusive-or logic so as to execute FEC processing calculation generating a remainder by a generator polynomial. For a FEC code on direct AU-4 message, the FEC processing circuit in parallel configuration for lowering an operational clock rate is determined by a matrix form calculation, which creates an output vector indicating a set of shift registers' data in a future clock timing from an input vector consisting of data stream in message and initial shift registers' values.

13 Claims, 21 Drawing Sheets

FIG.7

$$\begin{pmatrix} c'1 \\ c'2 \\ c'3 \\ c'4 \\ c'5 \\ c'6 \\ c'7 \\ c'8 \\ c'9 \\ c'10 \\ c'11 \\ c'12 \\ c'13 \\ c'14 \\ c'15 \end{pmatrix} = \begin{pmatrix} 0000000 & 1000000000000000 & 1 \\ 0000000 & 0100000000000000 & 1 \\ 0000000 & 0010000000000000 & 0 \\ 0000000 & 0001000000000000 & 0 \\ 0000000 & 0000100000000000 & 0 \\ 0000000 & 0000010000000000 & 0 \\ 0000000 & 0000001000000000 & 0 \\ 0000000 & 0000000100000000 & 0 \\ 0000000 & 0000000010000000 & 0 \\ 0000000 & 0000000001000000 & 0 \\ 0000000 & 0000000000100000 & 0 \\ 0000000 & 0000000000010000 & 0 \\ 0000000 & 0000000000001000 & 0 \\ 0000000 & 0000000000000100 & 0 \\ 0000000 & 0000000000000010 & 0 \end{pmatrix} \begin{pmatrix} i8 \\ i7 \\ i6 \\ i5 \\ i4 \\ i3 \\ i2 \\ i1 \\ c1 \\ c2 \\ c3 \\ c4 \\ c5 \\ c6 \\ c7 \\ c8 \\ c9 \\ c10 \\ c11 \\ c12 \\ c13 \\ c14 \\ c15 \end{pmatrix}$$

$$\begin{pmatrix} c''1 \\ c''2 \\ c''3 \\ c''4 \\ c''5 \\ c''6 \\ c''7 \\ c''8 \\ c''9 \\ c''10 \\ c''11 \\ c''12 \\ c''13 \\ c''14 \\ c''15 \end{pmatrix} = \begin{pmatrix} \overset{M2}{\begin{matrix}1&0&0&0&0&0&0&0&0&0&0&0&0&0&0\\0&1&0&0&0&0&0&0&0&0&0&0&0&0&0\\0&0&1&0&0&0&0&0&0&0&0&0&0&0&0\\0&0&0&1&0&0&0&0&0&0&0&0&0&0&0\\0&0&0&0&1&0&0&0&0&0&0&0&0&0&0\\0&0&0&0&0&1&0&0&0&0&0&0&0&0&0\\0&0&0&0&0&0&1&0&0&0&0&0&0&0&0\\0&0&0&0&0&0&0&1&0&0&0&0&0&0&0\\0&0&0&0&0&0&0&0&1&0&0&0&0&0&0\\0&0&0&0&0&0&0&0&0&1&0&0&0&0&0\\0&0&0&0&0&0&0&0&0&0&1&0&0&0&0\\0&0&0&0&0&0&0&0&0&0&0&1&0&0&0\\0&0&0&0&0&0&0&0&0&0&0&0&1&0&0\\0&0&0&0&0&0&0&0&0&0&0&0&0&1&0\\0&0&0&0&0&0&0&0&0&0&0&0&0&0&1\end{matrix}} & \overset{M3}{\begin{matrix}1&0&0&0&0&0&0&0\\1&1&0&0&0&0&0&0\\0&1&1&0&0&0&0&0\\0&0&1&1&0&0&0&0\\0&0&0&1&1&0&0&0\\0&0&0&0&1&1&0&0\\0&0&0&0&0&1&1&0\\0&0&0&0&0&0&1&1\\0&0&0&0&0&0&0&1\\0&0&0&0&0&0&0&0\\0&0&0&0&0&0&0&0\\0&0&0&0&0&0&0&0\\0&0&0&0&0&0&0&0\\0&0&0&0&0&0&0&0\\0&0&0&0&0&0&0&0\end{matrix}} \end{pmatrix} \begin{pmatrix} i8 \\ i7 \\ i6 \\ i5 \\ i4 \\ i3 \\ i2 \\ i1 \\ c1 \\ c2 \\ c3 \\ c4 \\ c5 \\ c6 \\ c7 \\ c8 \\ c9 \\ c10 \\ c11 \\ c12 \\ c13 \\ c14 \\ c15 \end{pmatrix}$$

FIG.20A

| | | | | | | | | | |
|---|---|---|---|---|---|---|---|---|---|
| | | | | SOH | | | | | |
| | A1 | A1 | A1 | A2 | A2 | A2 | C1 | + | + |
| RSOH | B1 | | | E1 | | | F1 | ✕ | ✕ |
| | D1 | | | D2 | | | D3 | ✕ | ✕ |
| PTR | H1 | H1 | H1 | H2 | H2 | H2 | H3 | H3 | H3 |
| | B2 | B2 | B2 | K1 | CB | CB | K2 | | |
| | D4 | | | D5 | | | D6 | | |
| MOSH | D7 | | | D8 | | | D9 | | |
| | D10 | | | D11 | | | D12 | | |
| | Z1 | Z1 | Z1 | Z2 | Z2 | Z2 | E2 | ✕ | ✕ |

FIG.20B

| | | | | | | | | | |
|---|---|---|---|---|---|---|---|---|---|
| | | | | SOH | | | | | |
| | A1 | A1 | A1 | A2 | A2 | A2 | C1 | + | + |
| RSOH | B1 | | | E1 | | | F1 | ✕ | ✕ |
| | D1 | | | D2 | | | D3 | | |
| PTR | H1 | H1 | H1 | H2 | H2 | H2 | H3 | H3 | H3 |
| | B2 | B2 | B2 | K1 | CB | CB | K2 | CB | CB |
| | D4 | CB | CB | D5 | CB | CB | D6 | CB | CB |
| MOSH | D7 | CB | CB | D8 | | | D9 | | |
| | D10 | | | D11 | | | D12 | | |
| | Z1 | Z1 | Z1 | Z2 | Z2 | Z2 | E2 | ✕ | ✕ |

LINE TERMINATING EQUIPMENT IN SDH NETWORKS, USING FORWARD ERROR CORRECTING CODES

BACKGROUND OF THE INVENTION

1. Field of the Invention

The present invention generally relates to optical transmission systems, employing line terminating equipments, which are applicable to long-distance SDH networks, and more particularly to terrestrial ones employing forward error correcting (FEC) codes to improve signal quality such as a bit error rate (BER).

2. Prior Art

Synchronous Digital Hierarchy (SDH) network is constructed under concept of a multi-layer structure which consists of path layer, multiplex-section layer and regenerator-section layer. The path layer is established between path terminating equipments (PTEs); the multiplex-section layer is established between line-terminating multiplexers (LT-MUXs); and a regenerator-section is defined as an interval of distance between two neighboring repeaters. Digital communication between PTEs is completed in these SDH equipments as following sequence. Data included in a path payload are transferred from the PTE to the LT-MUX, at which a path is multiplexed together with other paths to constitute a Synchronous Transport Module frame (i.e., STM-frame) with a section overhead (SOH) processed. A resultant STM-frame is transmitted toward an opposite LT-MUX through multiple regenerator-sections each of which is connected by repeaters. The LT-MUX on a receiver side terminates the SOH of the STM-frame and demultiplexes it into paths, which are delivered to a destined PTE. According to the CCITT recommendations concerning SDH optic transmission, wherein CCITT is the former party of International Telecommunications Union-Telecommunication (ITU-T), the STM frame is depicted in a matrix-type arrangement of bytes and is mainly divided into two paths: SOH and payload. The SOH is divided into two sub-portions: regenerator-section overhead (RSOH) and multiplex-section overhead (MSOH). Each byte in the RSOH is processed at the regenerator-section layer, and that in the MSOH at the multiplex-section layer. A certain number of SOH bytes have been defined for particular usages, while other SOH bytes remain to be undefined, which will be required for further customized utilizations.

There are provided two kinds of repeaters: regenerator (REP) and linear-repeater (L-REP). The REP is an opto-electronic equipment using optical-electrical converters and has regenerating, retiming, and reshaping functions, so is complicated in configuration and is expensive compared to the L-REP. L-REPs containing Er-Doped Fiber Amplifiers (EDFAs) are expected to be deployed frequently in optical transmission systems in the near future because of their cost effectiveness and their flexibility in terms of an operational bit rate. In terrestrial systems, their deployment leads to a mixture of L-REPs and opto-electrical REPs, where expanding REP's span by replacing REP with L-REP realizes more cost effective systems. However, with fewer REPs, concatenation of more L-REPs causes optical noise accumulation and increases total dispersion of a fiber line between REPs, which degrades optical waveforms and results in a Bit Error Rate (BER) floor. For example, in 10 Gbit/s optical transmission system where 19 L-REPs are employed in total line distance is 1260 km, transmitting power increase as much as 4 dB improves BER only slightly from $10^{-9}$ to $10^{-11}$. This is reported by the paper of "Design and Operation of Transmission Lines containing Er-Doped Fiber Amplifiers" for IEEE GLOBECOM 1992, P. 1875, provided by K. Aoyama, Y. Yamabayashi and K. Hagimoto. Therefore, method improving BER independent to transmitting power is strongly demanded: correcting bit errors by using Forward Error Correcting (FEC) codes. So far, the technology is mainly applied to radio communication systems, such as satellite or mobile communication which has a limitation of the transmitting power. Efforts are now made to apply FEC coding techniques in optical transmission systems, particularly in submarine transoceanic ones. Some of the studies are described below.

In 1991, Moro and Candiani performed 200 km-565 Mbit/s (700 Mbit/s after coding) optical non-regenerative transmission. Result of their experiment is described by the paper entitled "565 Mbit/s Optical Transmission System for Repeaterless Sections up to 200 km", provided by P. Moro and D. Candiani for IEEE ICC, 1991, p.1217. BCH (167, 151) code can perform error correcting function up to 2 bits in 167 bits, and a coding gain obtained was 2.5 dB, where 'BCH' is an abbreviation for 'Bose-Chaudhuri-Hocquenghem'. In 1992, Galba et al. demonstrated experiments using RS (255,239) code on a repeaterless transmission of 401 km at bit rate of 622 Mbit/s (710 Mbit/s after coding) as well as on a repeaterless transmission of 357 km at 2.4 Gbit/s (2.8 Gbit/s after coding), where 'RS' is an abbreviation for 'Reed-Solomon'. Results of the experiments are described in the paper entitled "410 km, 622 Mbit/s and 357 km, 2.488 Gbit/s IM/DD Repeaterless Transmission Experiments using Er-Doped Fiber Amplifiers and Error Correcting Code", provided by P. M. Galba, J. L. Pamart, R. Uhel, E. Leclerc, J. O. Prorud, F. X. Ollivier and S. Bordrieux for IEEE Photonics Technology Letters, Vol. 4, No. 10, 1992, p.1148. Despite their excellent correcting capability, these codes increase a line rate which may not be affordable in terrestrial high-speed systems: they are not consistent with a STM frame format based on the CCITT recommendation G. 707, 708, 709. These codes require a special transmission format, so all REPs employed in the system must be customized in order to cope with the special transmission format: conventional REPs cannot be applied to their FEC system.

Line rate increases can be avoided when check bits can be mapped into existing unused bytes in a signal form. Grover and Moore proposed an STS-1 path (52 Mbit/s) that is encoded in a (6208,6195) cyclic Hamming code. The proposal is described by the paper entitled "Design and Characterization of an Error-Correcting Code for the SONET STS-1 Tributary" provided by W. D. Grover and T. E. Moore for IEEE Transactions on Communications, Vol. 38, No. 4, p. 467. Thirteen check bits are mapped into Path Overhead (POH) auxiliary bytes in a SONET format. It requires no modification to physical interface or section termination circuits on the line. However, it is not straightforward to apply this proposal to paths other than STS-1. Concatenated Virtual Containers, such as VC-4-Xc (where X=1, 4, 16) will be introduced soon to convey ATM cells, where 'ATM' is an abbreviation for 'Asynchronous Transfer Mode'. Different codes have to be devised for those high-speed paths. Suzuki proposes an error correcting Hamming code for a concatenation path. The proposal is described by the paper of Japanese Patent Laid-Open No.6-29956, entitled "An Insertion Processing Method of Error Correcting Code in a SDH signal and an Optical Transmission Device", which is invented by Teruhiko Suzuki of Fujitsu Corporation Ltd. of Japan. Herein, a code-word is 'VC-4-16c'. According to the proposal, check bytes generated are inserted into a staff area existing for idle bits, wherein the staff area is provided at location between POH and payload in the VC-4-16c. This situation is depicted in FIG. 21. However, the method cannot be accepted for error correction scheme on the path other than VC-4-16c. Different FEC codes are necessary for different path speeds, moreover the error correction scheme is not applicable to a VC-4 frame because it does not have the staff area. Both of the methods are designed under concept that FEC is performed at the path layer. In considering a fact that a transmission line is switched to a protection line at LT-MUX based on bit errors detected by embedded B2 bytes in the MSOH, error corrections at the path layer cannot relieve frequency of undesirable bit-losses caused by line switching.

Paxal et al. has proposed a Reed-Solomon (524,522) code. The proposal is described by the paper entitled "Error-Correction Coding for High-Speed Optical Transmission Systems Based on the Synchronous Digital Hierarchy", European Transactions on Telecommunications (ETT), Vol. 4, No. 6, pp.623 provided by V. Paxal, P. Jourdain and G. Karam. In their proposal, a STM-1 payload is divided into three parts and each fraction is coded in a 12-parallel manner. Check bytes created by a FEC circuit are inserted not only in MSOH but also in RSOH. Herein, a FEC code is independent of path size, however, a FEC circuit must be deployed in each REP, and all REP circuits would have to be customized. In addition, the FEC code requires different coding circuits for different STM-N (where N>1) systems, while decoding process in each REP causes accumulation of significant end-to-end delay.

On the other hand, in a viewpoint of a processing circuit configuration, it is necessary to invent a special circuit configuration for the FEC code and its designing scheme is as follows:

A coding circuit of FEC codes in optical transmission systems is more complex than ordinary ones, because of large code-word size and because of its higher clock rate (e.g., 156 MHz). For the sake of low power consumption and cost effective implementations, the coding circuit could be realized on a C-MOS Field Programmable Gate Array (FPGA) circuit. However, at the higher clock rate (e.g., 156 MHz), it is impossible for FPGAs to process incoming data in a serial manner. Therefore, it is necessary to provide a special circuit configuration which enables parallel processing for the FEC codes.

An Example of a parallel processing circuit for cyclic codes is disclosed in the paper of Japanese Patent Laid-Open No. 52-86011, entitled "Error Correcting Device for Parallel Processing", which is invented by Nakamura of NEC Corporation Ltd. of Japan. In the paper, a (255,247) Hamming code for 4-parallel processing is described as an example. However, Nakamura's invention is not suitable for applications to FEC codes whose code-words are relatively large. The Nakamura's invention requires electric connections which generate data equivalent to a remainder of a specific polynomial division, expressed as follows:

$$r1(x^{64})^3+r2(x^{64})^2+r3(x^{64})+r4 \bmod (x^8+x^4+x^3+x^2+1) \quad (1)$$

In the above expression, 64th powers of 'x' is determined from a next equation (2), as follows:

$$4 \times 64 = 1 \pmod{255} \quad (2)$$

While in order to realize parallel processing of the FEC codes of large code-word size, division calculation, similar to (1), according to method of the Nakamura's invention, forces tremendous burdens to central processing unit (CPU). For example, a convenient mathematical program (e.g., Mathematica 2.0) takes more than six hours to obtain solution of 8-parallel processing of about 20000 code-word size. Therefore, it is necessary to provide a simple circuit configuration and its designing method in the parallel processing of large code-word.

SUMMARY OF THE INVENTION

It is an object of the present invention to provide a SDH based an optical transmission system in which a FEC circuit is employed in a LT-MUX, and errors, which occur in a transmission line, can be corrected at the multiplex-section layer without a bit-rate increase.

It is another object of the present invention to provide a FEC processing circuit which is simplified in configuration as well as in method of calculation.

An optical transmission system of the present invention is provided for the SDH network where communication between two LT-MUXs is executed in a form of a STM frame. A FEC circuit in the LT-MUX is preferably located between multiplex-section protection (MSP) and multiplex-section termination (MST). The FEC circuit comprises a FEC processing circuit which is designed to perform coding/decoding operations for a cyclic Hamming code selected, and a check bits inserting/delivering circuit which adds check bits generated to a MSOH field or which drops them from the MSOH field. The FEC processing circuit processes signals directly on each of AU-4 blocks which are derived from the STM frame. Strictly, the STM frame is subjected to k-bit interleaving (where 'k' is an integer larger than 1) in order to create a set of interleaved data branches: a code-word corresponds to each of the interleaved data branches. The check bits generated by a FEC coder circuit are embedded into undefined bytes' areas in the MSOH field. An FEC decoder executes error correction function based upon the check bits in the MSOH field.

The FEC processing circuit is constituted by shift registers and exclusive-or circuits so as to perform FEC processing generating a remainder of a polynomial division. Furthermore, in case of large code-word size, a special parallel processing scheme is employed. In order to realize parallel FEC processing circuits, a simplified matrix method is developed. We use a matrix whose input vector is a concatenation of vectors of incoming data stream and initial data of shift registers, and an output vector is data of shift registers after passing clocks. A matrix for m-clock (where m>1) is easily obtained from a one-clock matrix using property of cyclic codes. And matrix representation is directly related to a circuit configuration by modulo 2 Galois field algebra.

BRIEF DESCRIPTION OF THE DRAWINGS

These and other objects of the subject invention will become more fully apparent as the following description is read in light of the attached drawings wherein:

FIG. 7 shows matrix which is used to realize a FEC processing circuit configuration for the present invention;

FIG. 8 shows a matrix which is used to structure a FEC processing circuit for the present invention;

FIGS. 20A and 20B show examples of arrangements of a SOH field according to the first and fifth embodiments.

DESCRIPTION OF THE PREFERRED EMBODIMENTS

[A] First Embodiment

Figure 1A:
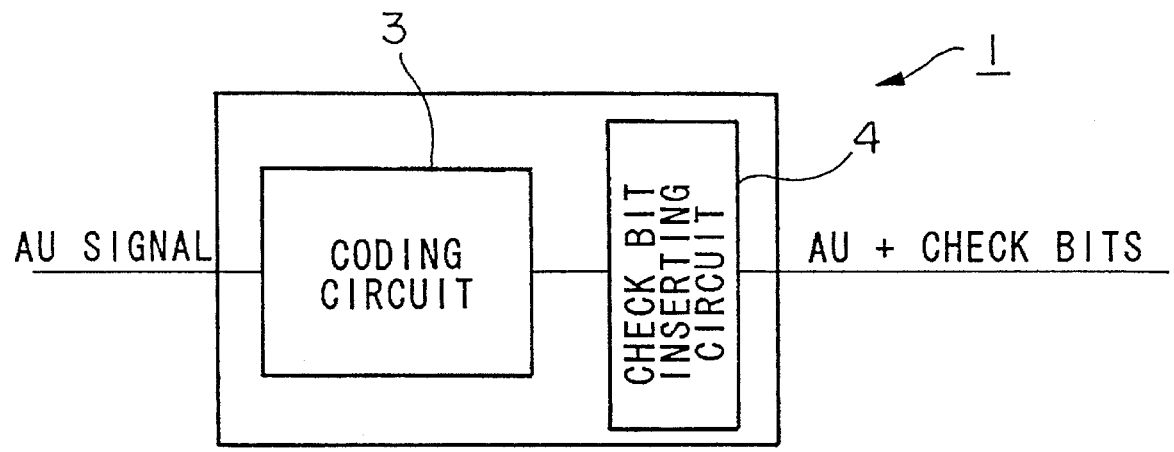
FIG. 1A is a block diagram illustrating a FEC coding circuit employed by a first embodiment of the present invention.
Figure 1B:
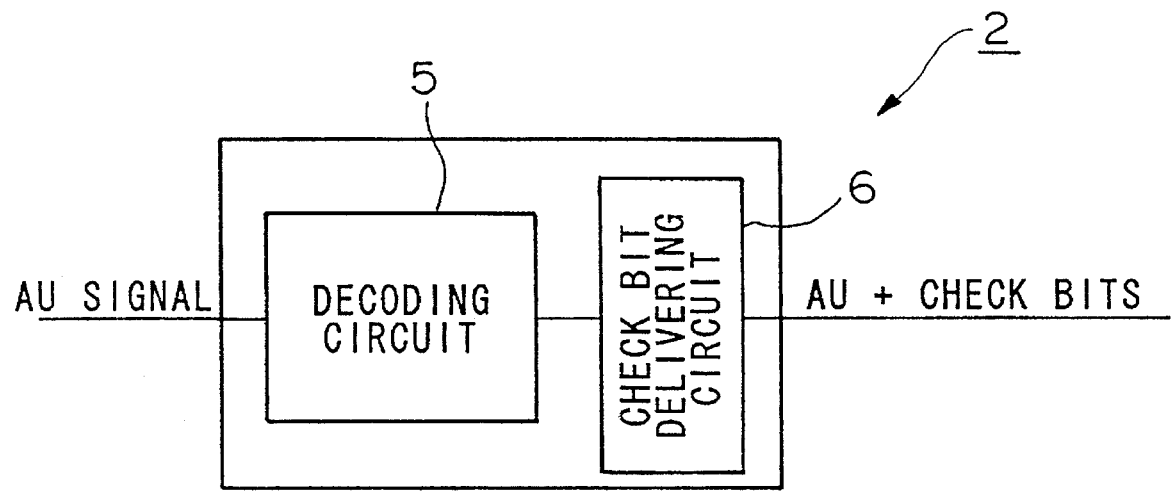
FIG. 1B is a block diagram illustrating a FEC decoding circuit employed by the first embodiment.

FIGS. 1A and 1B show a FEC circuit, wherein FIG. 1A shows a FEC coding circuit 1 and FIG. 1B shows a FEC decoding circuit 2. Those circuits are located in the LT-MUX to realize processing at the multiplex-section layer on cyclic Hamming codes by which a single error in a code-word is corrected.

In the first embodiment, an Administrative Unit (AU) containing pointer bytes is used as a message unit. As for VC-3 and VC-4 paths, an AU-4 is a message unit, while for VC-4-Xc (where X=4, 16), X-parallel arraying data of AU-4-Xc is used as a message unit, which is approximately equals to the AU-4. The description will be given with respect to a message based on the AU-4. The reason why the AU-4 is used as the message unit is as follows:

In some case of clock adjustment, not only in frequency but also in phase, some data are protruded in a region of pointer bytes 'H3', and the data protruded should be included in the message unit. If there is no possibility of such a case, it is possible to use signal of VC-4 as the message unit, although the FEC processing should still be at the multiplex-section layer in the LT-MUX. The first embodiment is designed as direct processing of AU-4. Herein, fifteen check bits are required, so only 2 check bytes are used within vacant 24 undefined bytes in a MSOH field. This code-word of length 18880, which consists of an AU-4 message and the check bytes, leads us to a (18880,18865) shortened Hamming code.

The FEC coding circuit 1 of FIG. 1A comprises a coding circuit 3 and a check bit inserting circuit 4. This circuit 1 performs FEC coding on the AU-4, and then, the check bits are written into the undefined MSOH field. The FEC decoding circuit 2 of FIG. 1B comprises a decoding circuit 5 and a check bit delivering circuit 6. The circuit 2 checks existence of a code-word, and then, if the code-word is obtained, an error bit in the message unit is corrected. The check bit delivering circuit 6 removes the check bits from the MSOH field, and then, the check bits together with the message are delivered to the decoding circuit 5. The circuit 2 has a function which stops a correction mechanism when multiple errors occur in a single message frame. Therefore, it is possible to minimize an effect of error infection due to the decoding. Statistically, an input BER before correction of $10^{-5}$ is identical approximately to a corrected BER value. Since the optical transmission line has BER better than the above input BER, it is possible to obtain a coding gain by the error correcting.

Figure 2:
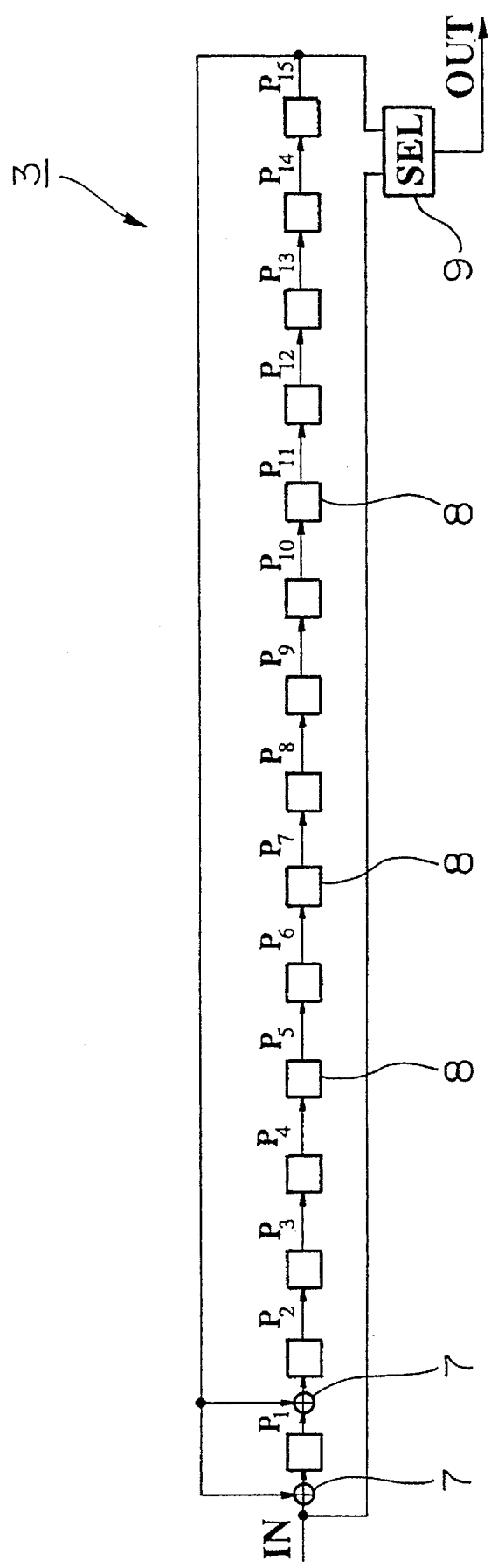
FIG. 2 is a block diagram depleting an example of the FEC coding circuit shown in FIG. 1A.
Figure 3:
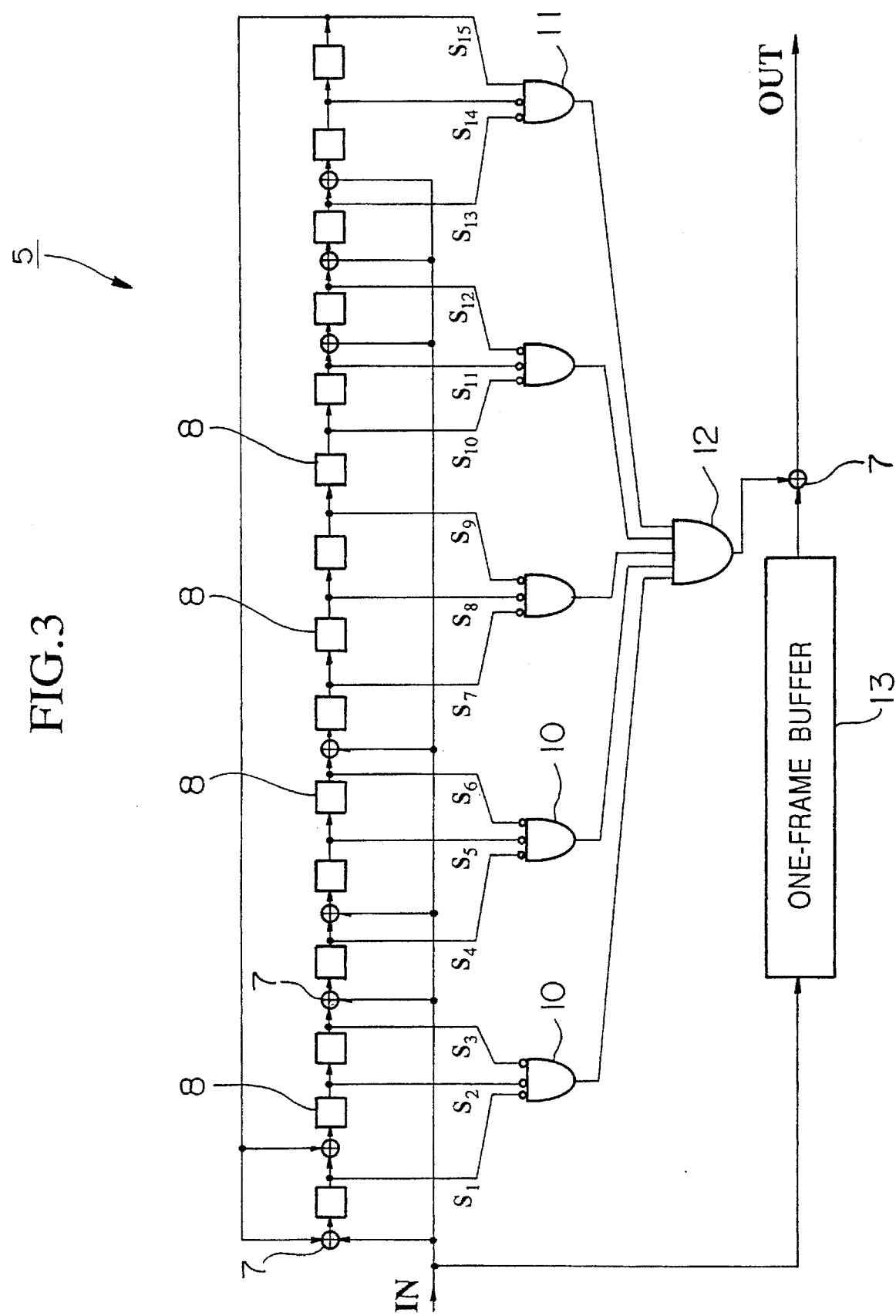
FIG. 3 is a block diagram illustrating an example of the FEC decoding circuit employed by the first embodiment.

Next, FIG. 2 expresses an example of a detail configuration of the coding circuit 3 and FIG. 3 illustrates an example of a detail configuration of the decoding circuit 5. The coding circuit 3 of FIG. 2 contains exclusive-or circuits 7, shift registers 8 and a selector 9. Herein, the shift register consists of a flip-flop (or flip-flops), and the selector 9 has a switch which selects a single port from two incoming ports. The selector 9 also includes a check bit writing circuit which records and writes check bits in the MSOH field. Configuration of the shift registers 8 is provided to perform computation in which a polynomial, representative of a data stream, is divided by an irreducible generator polynomial of $(x^{15}+x+1)$ so as to produce a remainder. A set of remainder bits are result of the computation, which is represented by check-bit signals P1 to P15. The selector 9 switches either the message to be passed through or the check bits: after the data stream passes through the selector 9, it is inverted so that a remainder of division is added to the MSOH field.

Figure 4:
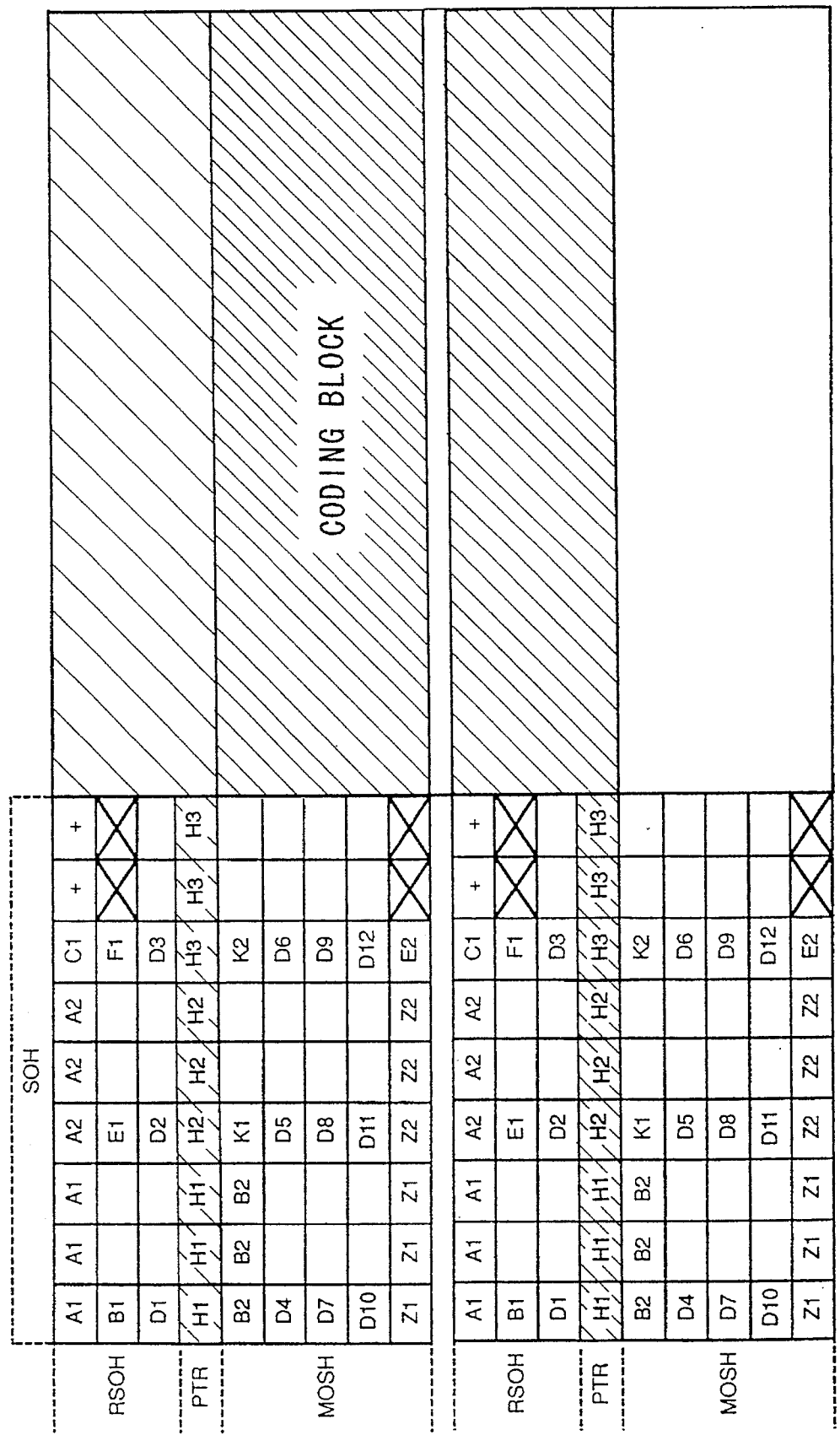
FIG. 4 is a block diagram showing an example of a message block in a STM frame employed by the first embodiment.

The decoding circuit 5 of FIG. 3 comprises the exclusive-or circuits 7, the shift registers 8, 3-input AND gates 10 and 11, a 5-input AND gate 12 and a one-frame buffer 13. Herein, the AND gate 10 has three negative inputs, while the AND gate 11 has two negated inputs. Configuration of the AND gates is an example, so any other combinations expressing logic depicted are available. The decoding circuit 5 is designed such that a polynomial representative of receiving data is multiplied by $(x^{13}+x^{12}+x^{11}+x^6+x^4+x^3+1)$, and then, result of multiplication is divided by $(x^{15}+x+1)$ to produce a remainder (i.e., syndrome) which is represented by resultant signals S1 to S15. If no error occurs in the data, the syndrome is always zero: S1 to S15 are all 0. A single error happening in the message causes a non-zero syndrome, in other words, at least one of the signals S1 to S15 is 1. Therefore, it is possible to specify which bit is erroneous in the message unit by finding out a pattern of syndrome bits S1 to S15. In the decoding circuit 5, a non-zero syndrome produced by a single error is circulated by a set of the registers 8, while the data are stored in the one-frame buffer 13. Circulation of the non-zero syndrome and buffering of the data are performed in synchronization with a same clock. While circulating the non-zero syndrome, there certainly comes a moment at which fifteen bits are '100000000000000'. In that moment, an output-data bit of the one-bit frame buffer 13 is an error bit. Such error bit is corrected by the exclusive-or circuit 7. Incidentally, a unit of error-correcting message block starts from a head point of 5th row of payload of the AU-4, and ends at a tall point of 4th row of payload containing a pointer of a next frame, as is shown in FIG. 4. By using such a phase of the message block, it is possible to reduce a number of buffering bits. In the first embodiment, each of the coding circuit 3 and the decoding circuit 5 is constituted by the shift registers 8, however, a detail configuration of the first embodiment can be modified. For example, the circuit can be realized by the exclusive-ors only, so is not necessary to use the shift registers.

[B] Second Embodiment

Figure 5:
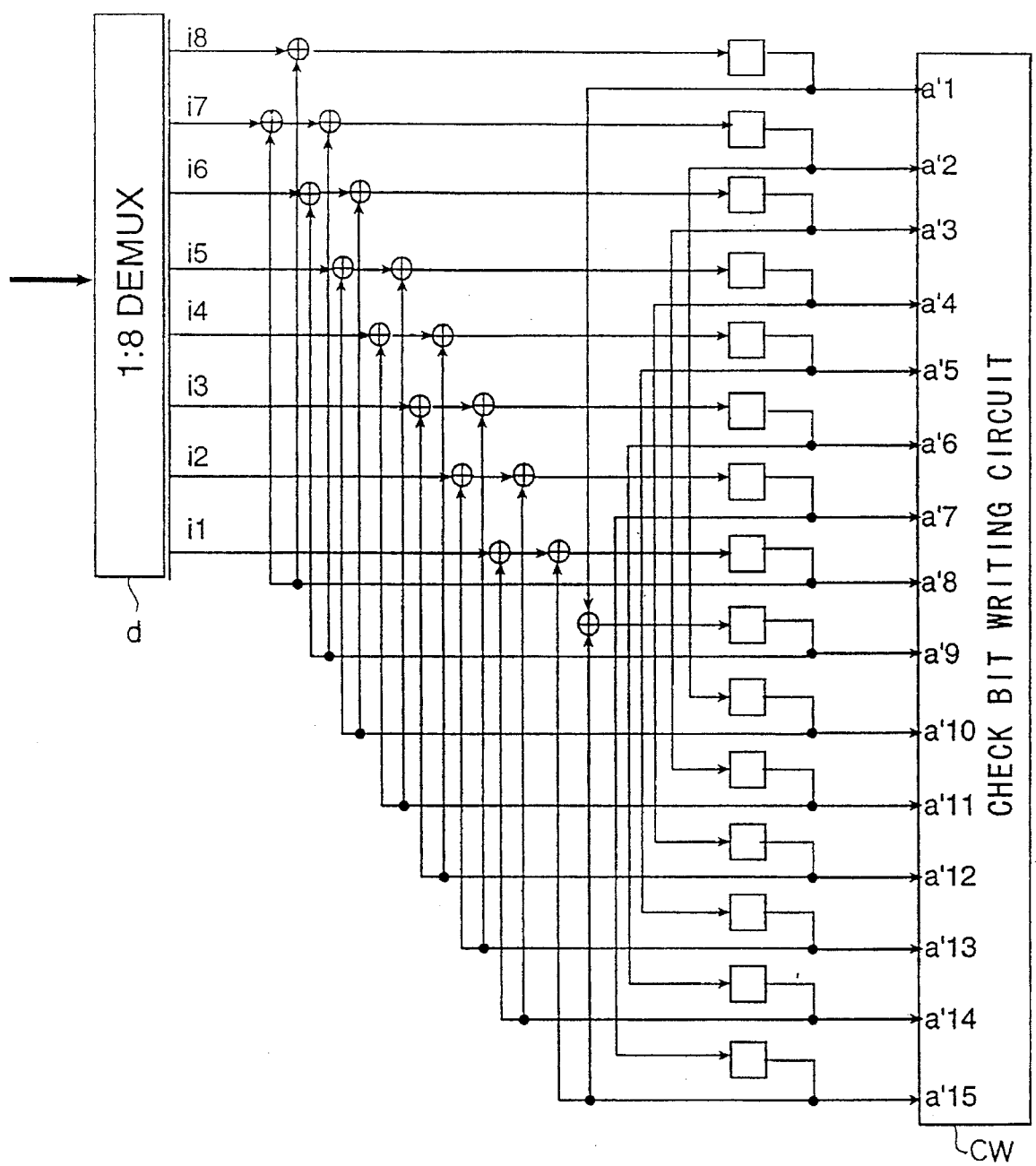
FIG. 5 is a block diagram showing an 8-parallel FEC transmission system according to a second embodiment of the present invention.
Figure 6:
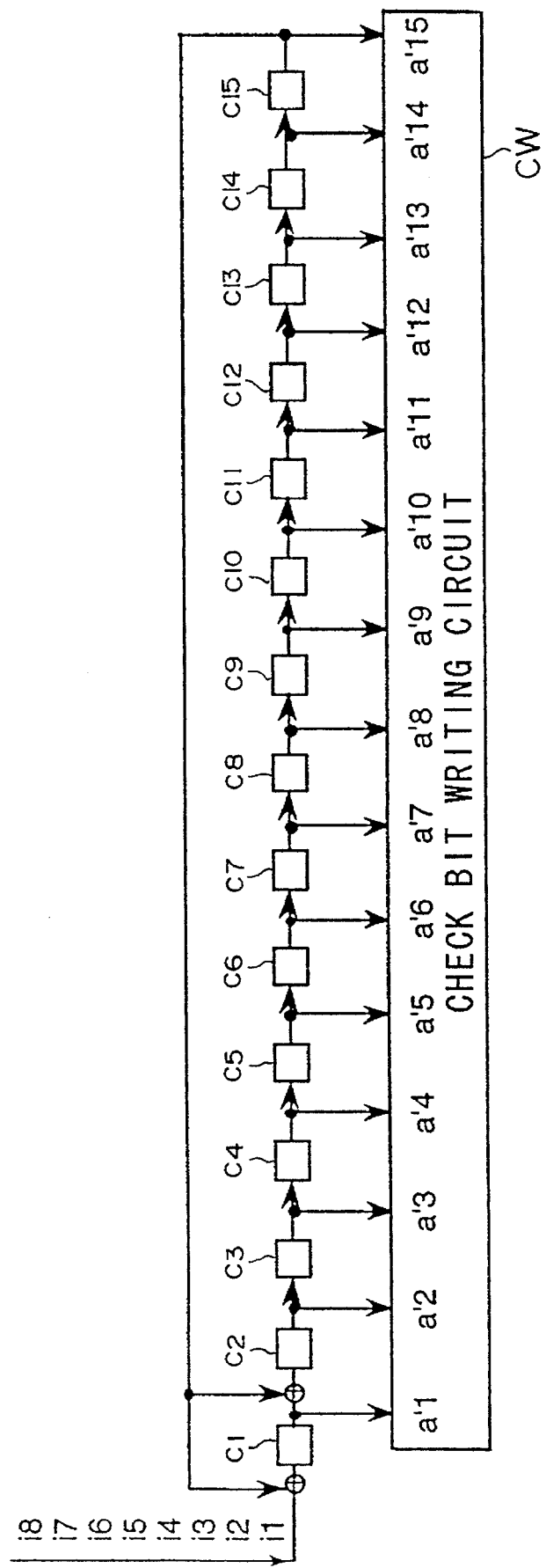
FIG. 6 is a block diagram showing a serial FEC processing circuit according to the second embodiment.

FIGS. 5 and 6 are detailed configurations of processing circuit in accordance with a second embodiment of the present invention. The FEC processing circuit of FIG. 5 is an 8-parallel processing circuit for a (18880,18865) Hamming code, while that of FIG. 6 is a serial FEC processing circuit for the same Hamming code.

The serial FEC processing circuit depicted in FIG. 6 is designed as a logical-operation circuit to achieve normal processing similar to that in the first embodiment, although the selector 9 and data path are not depicted. Each of shift registers c1 to c15 in FIG. 6 is a one-bit register. Data launched to the first register c1 are sequentially shifted toward the last shift register c15 in accordance with clock progressing. Data retained by the shift registers c1 to c15 are respectively denoted by the numerals 'c1' to 'c15' as well. A data stream i1 to i8 are sequentially applied to the shift register c1, wherein number '8' in 'i8' is determined by a parallel dimension demanded. Numerals a'1 to a'15 represent resultant check bits. A check bit writing circuit CW records a'1 to a'15 in a check byte position in a STM frame in order to transmit them with data.

The shift register c1 receives result of an exclusive-or operation between the data stream i1 to i8 and data of the shift register c15. The shift register c2 receives result of an exclusive-or operation between data of the shift registers c1 and c15. Further, the shift registers c3 to c14 are connected only in series: there are no feed-back connections. In short, a connection of the shift registers c1 to c15 in FIG. 6 achieves a logical operation producing a remainder of a division of a string of data polynomial by a generator polynomial, "$x^{15}+x+1$".

The (18880,18865) Hamming code is a shortened code, so 13887 of "0" dummy bits are added, and a required number of clocks to generate the check bits is 32767. Herein, an operation speed of the shift register is set at 156 MHz. In FIG. 6, it should be noted that a data-input port is located at a 'c1' side: a reverse direction to that of clock shifting.

Here, operations of the serial FEC processing circuit of FIG. 6 are described with respect to a transition between two states: a current state and an initial state, wherein the current state is established one clock after the initial state. In the initial state, a string of data is represented by the numerals i1 to i8, while the shift registers retain the data c1 to c15 respectively. In the current state, data of shift registers are expressed by c'1 to c'15. Relationship of data between the two states is represented as follows:

$c'_1 = i_1 + c_{15}$, $c'_2 = c_1 + c_{15}$, otherwise $c'_j = c_{j-1}$ (where $3 \leq j \leq 15$)    (3)

To describe the relationship, we use a matrix of dimension (Nm+Nr)×Nr, where 'Nm' and 'Nr' are numbers of parallel ports and shift registers, respectively. An input vector is a concatenation of vectors of incoming data stream represented as {ik} (where $1 \leq k \leq Nm$) and initial data of the shift register is given as {cj} (where $1 \leq j \leq Nr$). An output vector is data of the shift registers after passing clocks, and is expressed as {c'j} (where $1 < j < Nr$). Herein, matrix representation is directly related to circuit configuration by modulo 2 Galois field algebra. In our method, a matrix for one parallel process is induced simply from a serial process as follows:

In an 8-parallel (18880,18865) Hamming code, Nm=8, Nr=15, so transpose of the input vector is (i8, i7, ..., i1, c1, c2, ..., c15), while transpose of the output vector after passing one clock is (c'1, c'2, ..., c'15). According to (3), a serial matrix for one clock is illustrated in FIG. 7, and also in a next expression, as $T(1) = [v \; Ib_1]$    (4)

where '$v$' is a zero matrix of 7×15 dimension, 'I' is a unit matrix of 15×15, and $b_1$ is a column vector whose transpose is (1,1,0,0,0,0,0,0,0,0,0,0,0,0,0). Shifting each column vector to the left (m−1) times using the property of the cyclic codes yields a following parallel matrix which is represented in FIG. 8 as, $T(8) = [I \; b_1 \; ... \; b_8]$    (5)

where a transpose vector of $b_2$ is (0,1,1,0,0,0,0,0,0,0,0,0,0,0,0), and similarly, that of $b_8$ is (0,0,0,0,0,0,0,1,1,0,0,0,0,0,0). An output vector of (5) for 1 clock is equivalent to that of (1) for 8 clocks. The proposed matrix method is remarkably simple as compared to the Nakamura's proposal described before and another technology described in the paper entitled "Parallel Scrambling Techniques for Digital Multiplexers", AT&T Technical Journal, Vol.65, Issue 5, p.123, provided by W. D. Choi. This is because a complex division calculation or self-products of the matrix are not necessary, which is more advantageous for larger scale processing. Complexity of calculation method can be estimated in terms of a number of calculated bits. In case of our FEC code, our method processes only O(345) bits, on the other hand, the method of Nakamura requires O(822083584) bits, that of Choi processes O(4232) bits, where 'O(x)' is the Landau' symbol which represents an order estimation. The scheme is general method for arbitrary cyclic codes, although the proof is omitted out of this article. A required number of clocks 32767 in serial processing cannot be divided clearly by 8, so more one dummy bit is inserted for consistency of clocks. A required clock number at 19.5 MHz for parallel processing is 4096. A check bit creation circuit is depicted in FIG. 5, where 15 registers are connected by exclusive-ors in accordance with the matrix form (5). In FIG. 5, a logical processing configuration employs 16 exclusive-ors, on the other hand in the circuit configured using the Nakamura's invention, at least 29 exclusive-ors are necessary. The present embodiment of FIG. 5 can offer a simple circuit configuration for the 8-parallel processing. In FIG. 5, a serial-parallel conversion circuit (i.e., "1:8 DEMULTIPLEXER") 'd' employing 8 parallel output ports and a check bit writing circuit 'CW' are interconnected with shift registers and exclusive-ors.

[C] Third Embodiment

Figure 9:
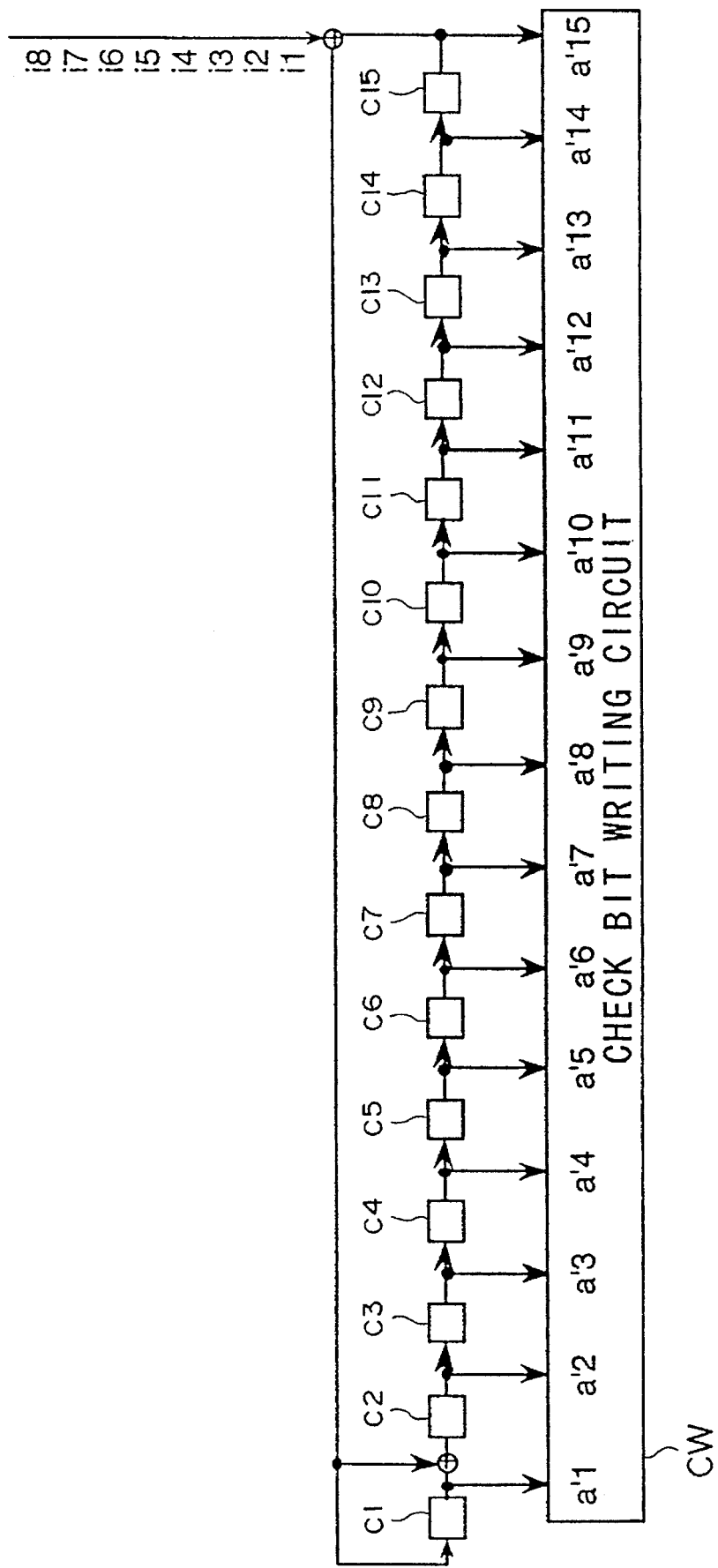
FIG. 9 is a block diagram showing a serial FEC processing circuit according to a third embodiment of the present invention.

Hereafter, a third embodiment of the present invention is described with reference to FIG. 9 and FIG. 10. FIG. 9 shows a configuration of a serial FEC processing circuit for a (18880,18865) Hamming code, wherein notations of circuit components and numerals are equivalent to those of FIG. 6. Different from the circuit of FIG. 6, an input port of data stream is located at a side of the register c15 which corresponds to a progressing direction of clocks. A number of clocks to obtain check bits is 32752 in a circuit of FIG. 13. Relationship between numerals of two states: a state after one clock progressing and the initial state, as, $$c'_1=i_1+c_{15},\ c'_2=c_1+c_{15}+i_1,\ \text{otherwise}\ c'_j=c_{j-1}\ (\text{where}\ 3\leq j\leq 15) \quad (6)$$

In a later state established 8 clocks after the initial state, data of the shift registers are represented as follows:

$$c''_1=c_1+i_8$$

$$c''_j=c_{j+6}+c_{j+5}+i_{9-j}+i_{10-j}\ (\text{where}\ 2\leq j\leq 8)$$

$$c''_9=c_1+c_{15}+i_1$$

$$c''_k=c_{k-8}\ (\text{where}\ 10\leq k\leq 15) \quad (7)$$

Figure 10:
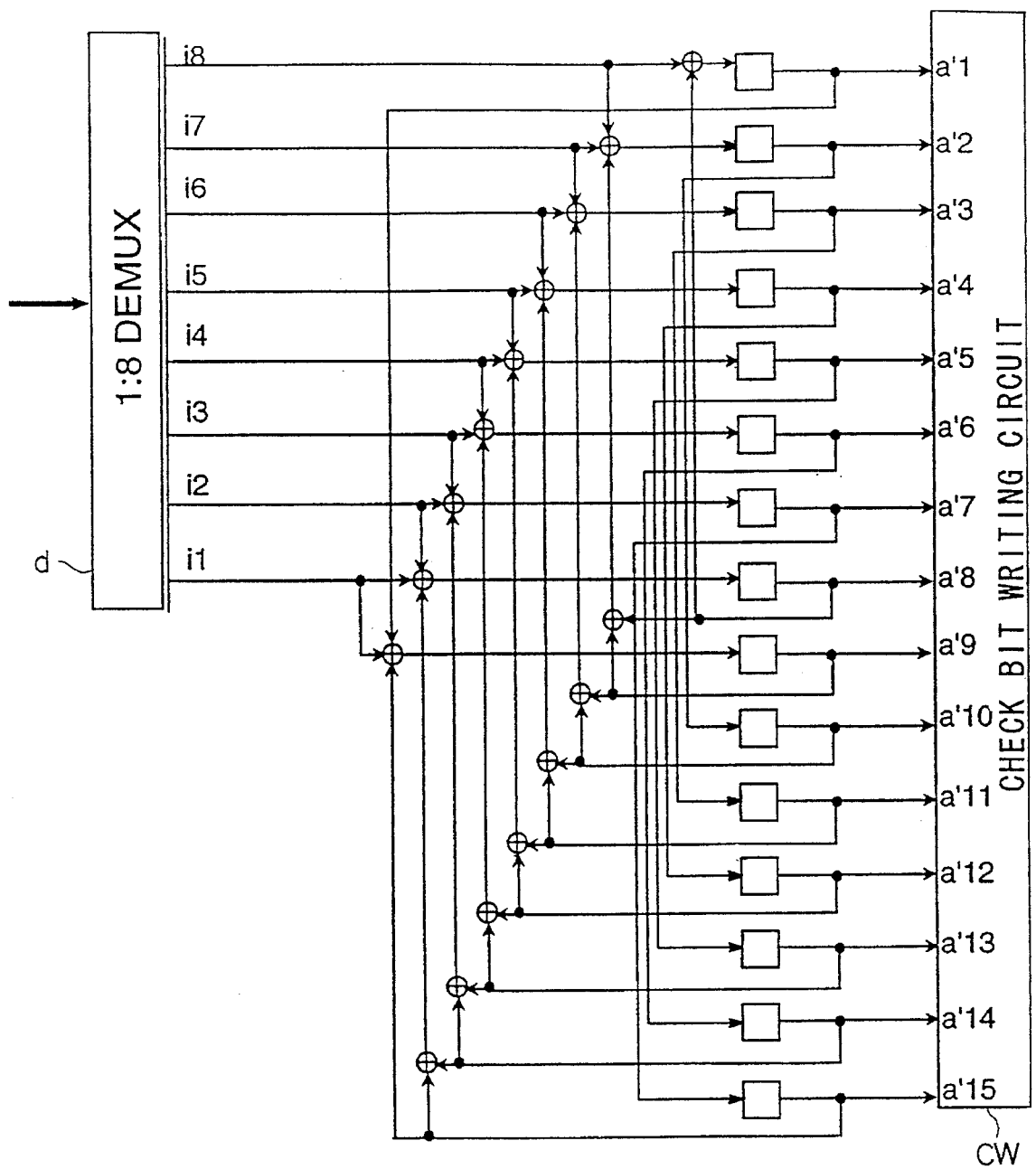
FIG. 10 is a block diagram showing an 8-parallel FEC processing circuit according to the third embodiment.
Figure 13:
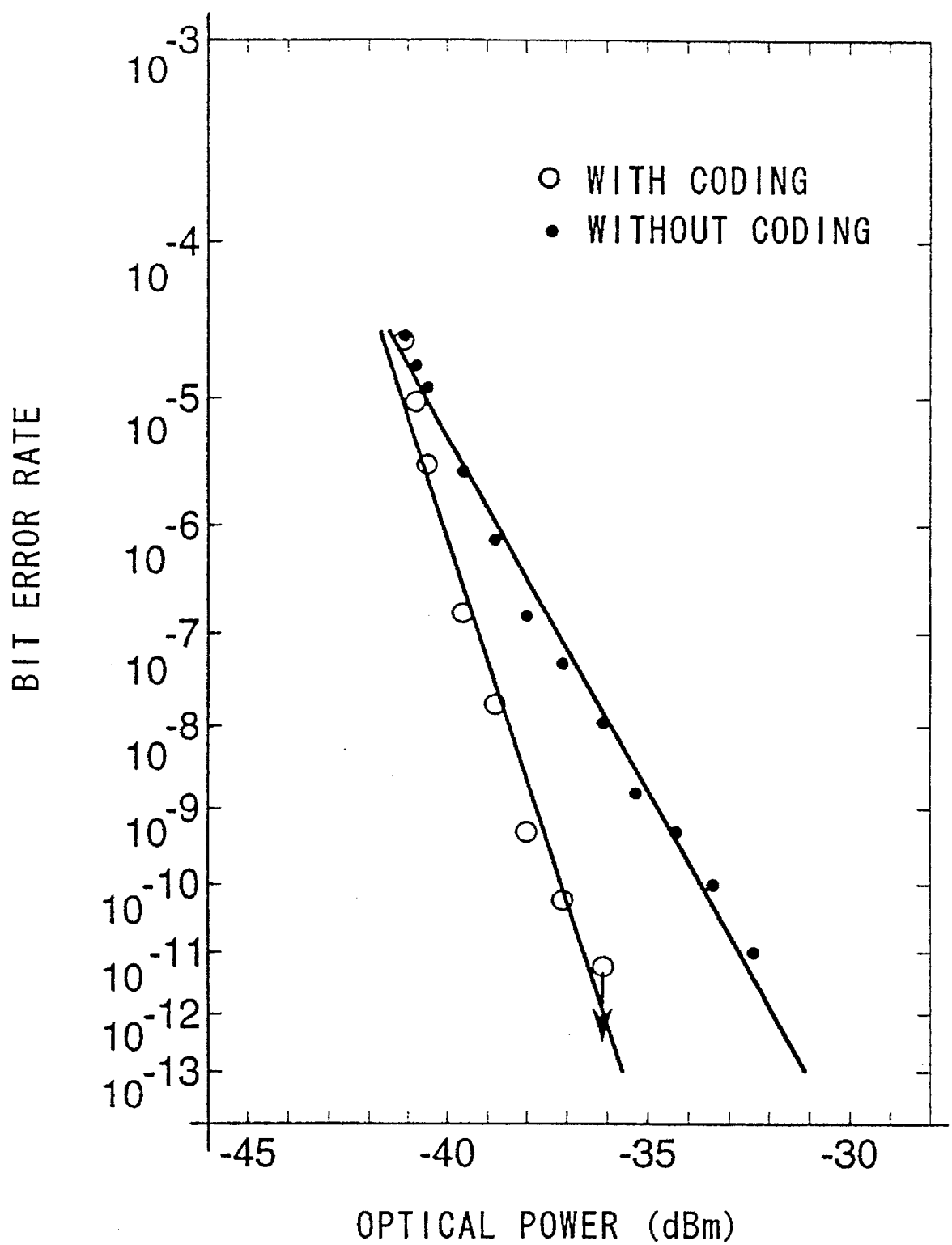
FIG. 13 is a graph depicting results of an experiment using the third embodiment.

FIG. 10 shows a configuration of an 8-parallel FEC processing circuit for the (18880,18865) Hamming code, wherein parts equivalent to those of FIG. 13 will be designated by the same numerals. Since a number of 32752 is divided clearly by 8, it is not necessary to add a dummy bit for clock consistency, and a resultant clock number for check bit creation is 4096 at 19.5 MHz speed. As similar to the aforementioned circuit of FIG. 5, a circuit of FIG. 10 comprises 15 shift registers, however, a number of exclusive-ors is 24, where a single 3-input-type exclusive-or is counted as 2. In FIG. 10, a serial-parallel conversion circuit 'd' and a check bit writing circuit 'CW' are interconnected with 15 shift registers and 24 exclusive-ors so as to realize the logical processing of FIG. 9 at a lower clock rate. If some restriction is provided in circuit configuration, it is possible to use either the second embodiment or third one selectively.

[D] Fourth Embodiment

The code processing circuits described heretofore are designed such that 32767 or 32752 clocks at 156 MHz are required to process the shortened code. Approximately a half the number of those clocks are used for the dummy bits. Some methods are conventionally known to reduce a number of redundant clocks. One method is described by the book entitled "Error Control Coding: Fundamentals and Applications" provided by S. Lin and D. J. Costello Jr. for Prinston-Hall 1983. When the above method is applied to processing of the (18880,18865) Hamming code, it is possible to obtain a circuit configuration of FIG. 11. Incidentally, a polynomial, provided for shortening for the (18880, 18865) Hamming code, can be obtained as a next expression as $$x^{(n-k+j)}\ \text{mod}\ (x^{15}+x+1) \quad (8)$$

Figure 11:
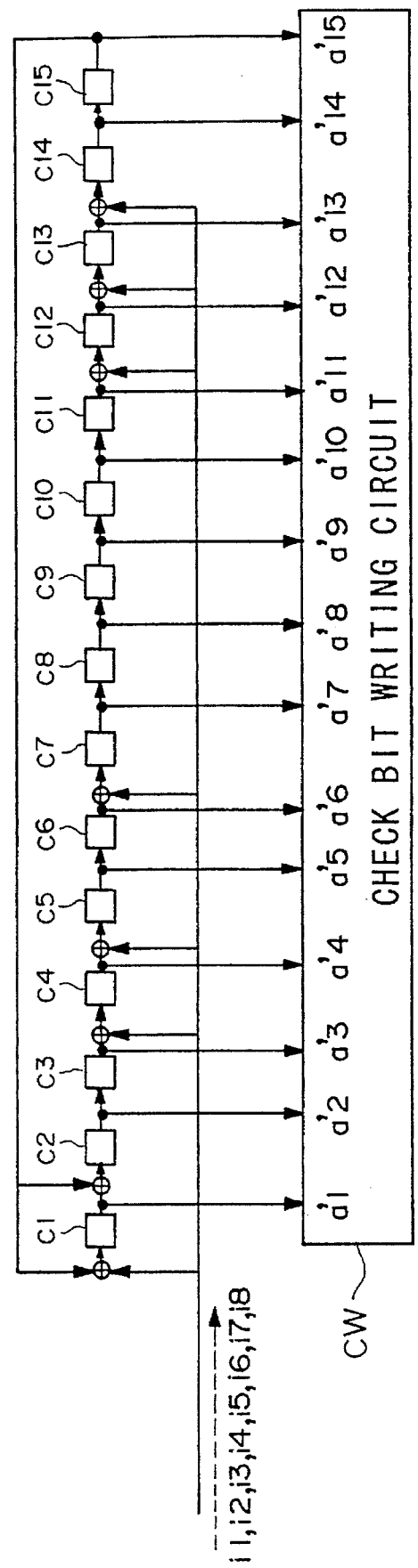
FIG. 11 is a block diagram showing a serial FEC processing circuit according to a fourth embodiment of the present invention.

In the above polynomial (8), 'n' represents a code-word length 18880, and 'k' represents a message length 18865, and 'j' is a number of redundant dummy bits 13887. Data are multiplied by the polynomial (8) for shortening which is calculated as "$x^{13}+x^{12}+x^{11}+x^6+x^4+x^3+1$", and then resultant multiplied data is divided by a generator polynomial to yield a remainder. A number of clocks, reduced by utilizing the circuit configuration of FIG. 11, is 18864 at 156 MHz speed.

Figure 12:
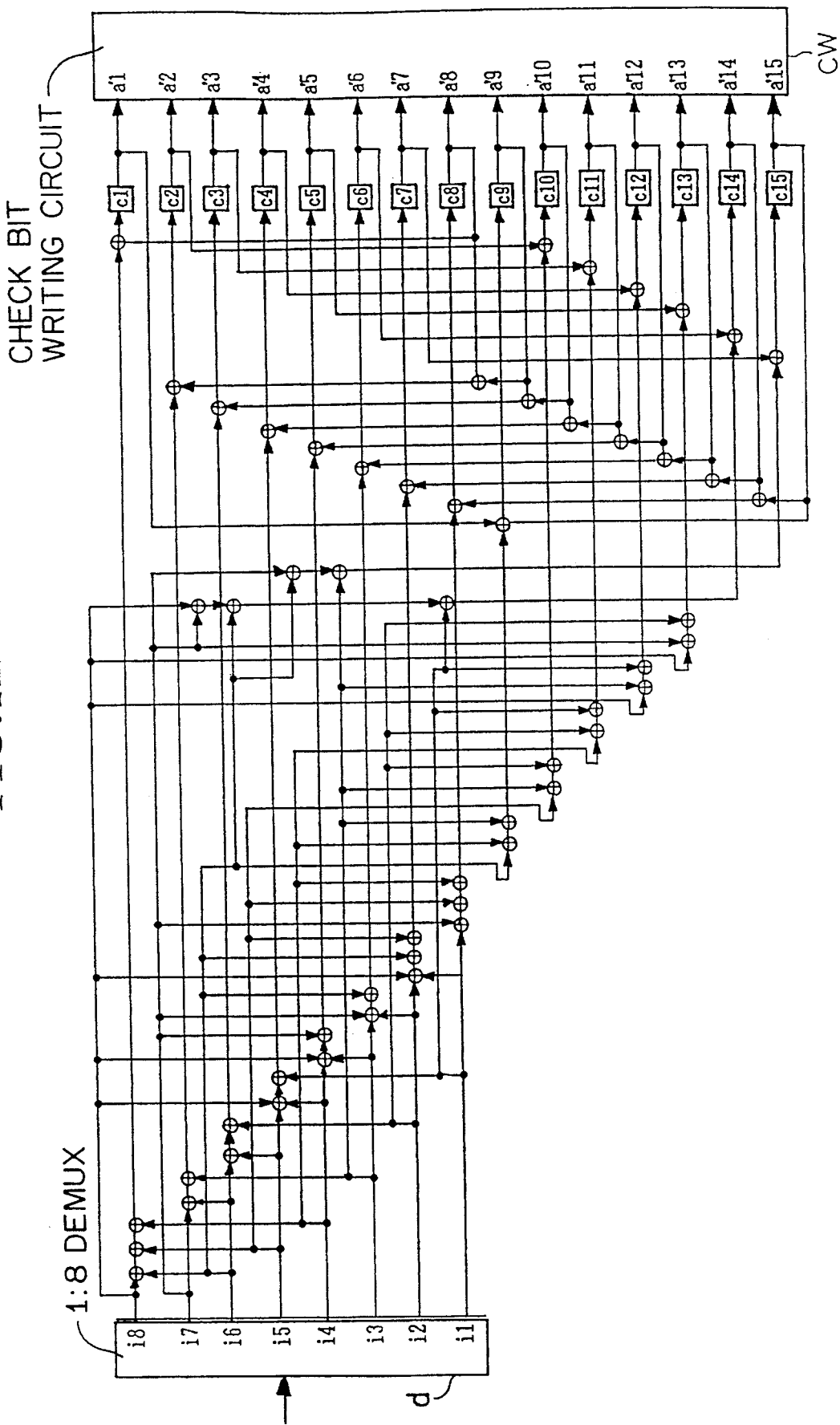
FIG. 12 is a block diagram showing an 8-parallel FEC processing circuit according to the fourth embodiment.

A circuit of FIG. 12, according to the fourth embodiment, is provided for 8-parallel processing at 19.5 MHz clock rate. Incidentally, writing of check bits is performed 2358 clocks later. According to the circuit of FIG. 12, it is possible to reduce a number of required clocks, so the circuit enables suppression of processing delay. However, the circuit of FIG. 12 requires a relatively large number of exclusive-ors amounts to 61, which is 3.8 times larger than that of the second embodiment and 2.5 times larger than that of the third embodiment.

Figure 14:
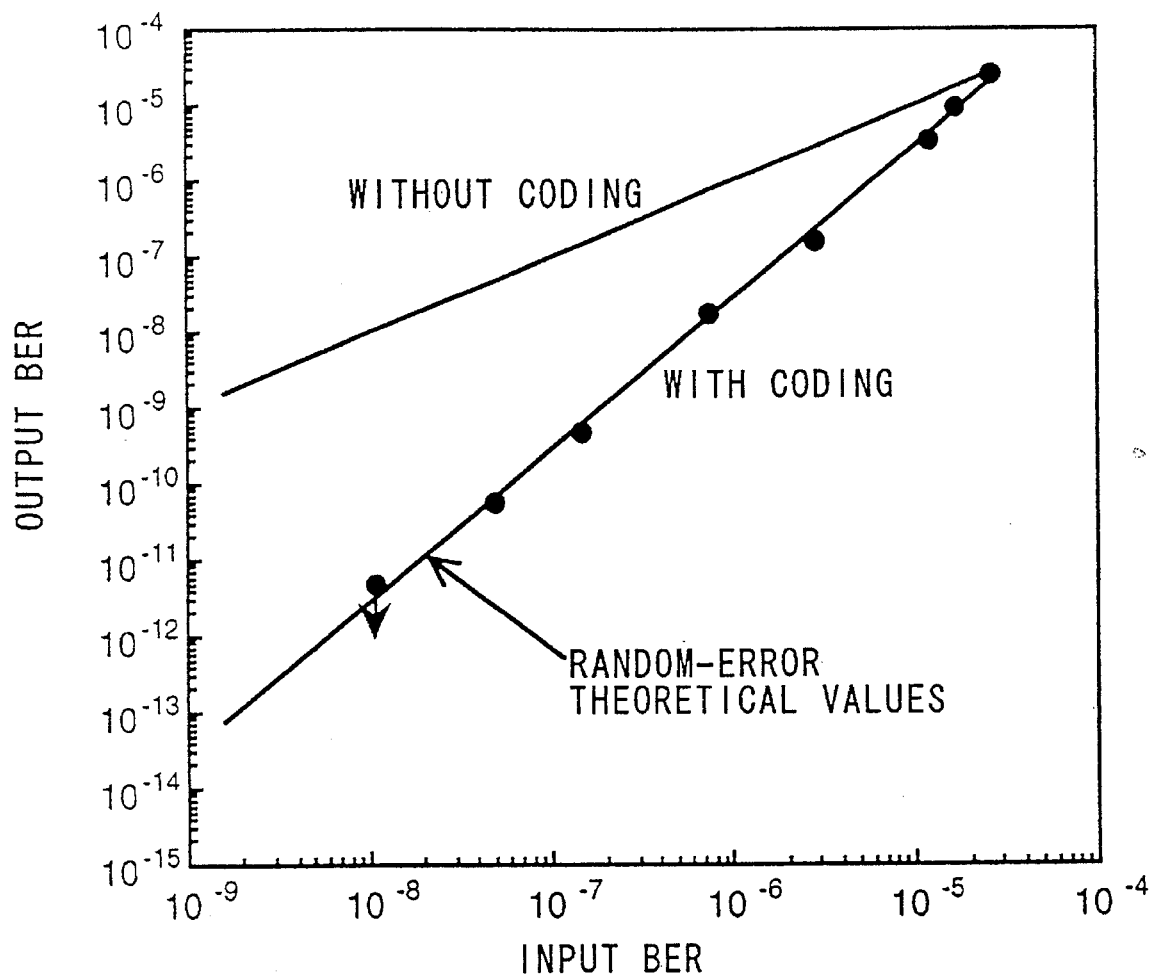
FIG. 14 is another graph depicting results of an experiment using the third embodiment.

By using the circuit configuration described in the third embodiment, we conducted an optical back-to-back experiment at 156 Mbit/s using an optical attenuator to vary optical power. Results of the experiment, shown in FIG. 13, confirm that the proposed FEC code improves BER performance, with coding gain of 3 dB at BER of $10^{-9}$. FIG. 14 depicts relationship between an input BER and an output BER, where a solid line represents theoretical values assuming that errors occur randomly. The agreement of the theory and the experiment acknowledge that function of the (18880, 18865) Hamming code is realized in practice with accuracy in error-correcting performance.

As described heretofore, the second to fourth embodiments can provide the FEC processing circuits all of which are applicable to SDH network equipments, wherein merely lower clock speeds are required, with lower electric power consumption and a simple configuration. The circuits according to the second to third embodiments require a small number of exclusive-ors, which is approximately one-third to one-fourth of that of the fourth embodiment, therefore, they are preferable when a circuit scale should be restricted. The fourth embodiment is advantageous in case that delay problem is severe.

Although in the embodiments, a number of parallel ports is set at 8, of course, the embodiments are applicable to a FEC circuit, which has an arbitrary number of parallel ports, in the SDH network system.

[E] Fifth Embodiment

Figure 15:
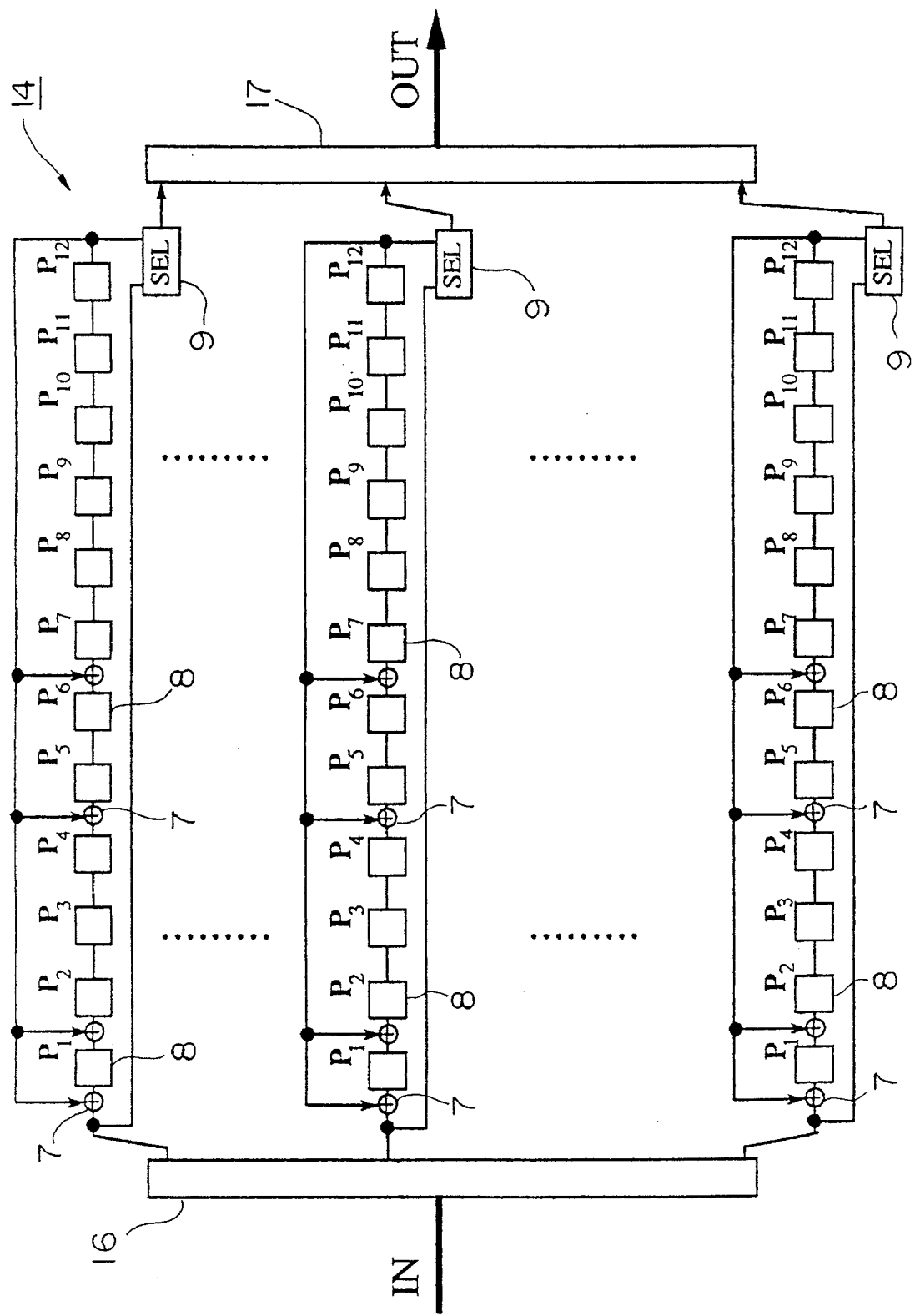
FIG. 15 is a block diagram illustrating an example of a FEC coding circuit employed by a fifth embodiment of the present invention.
Figure 16:
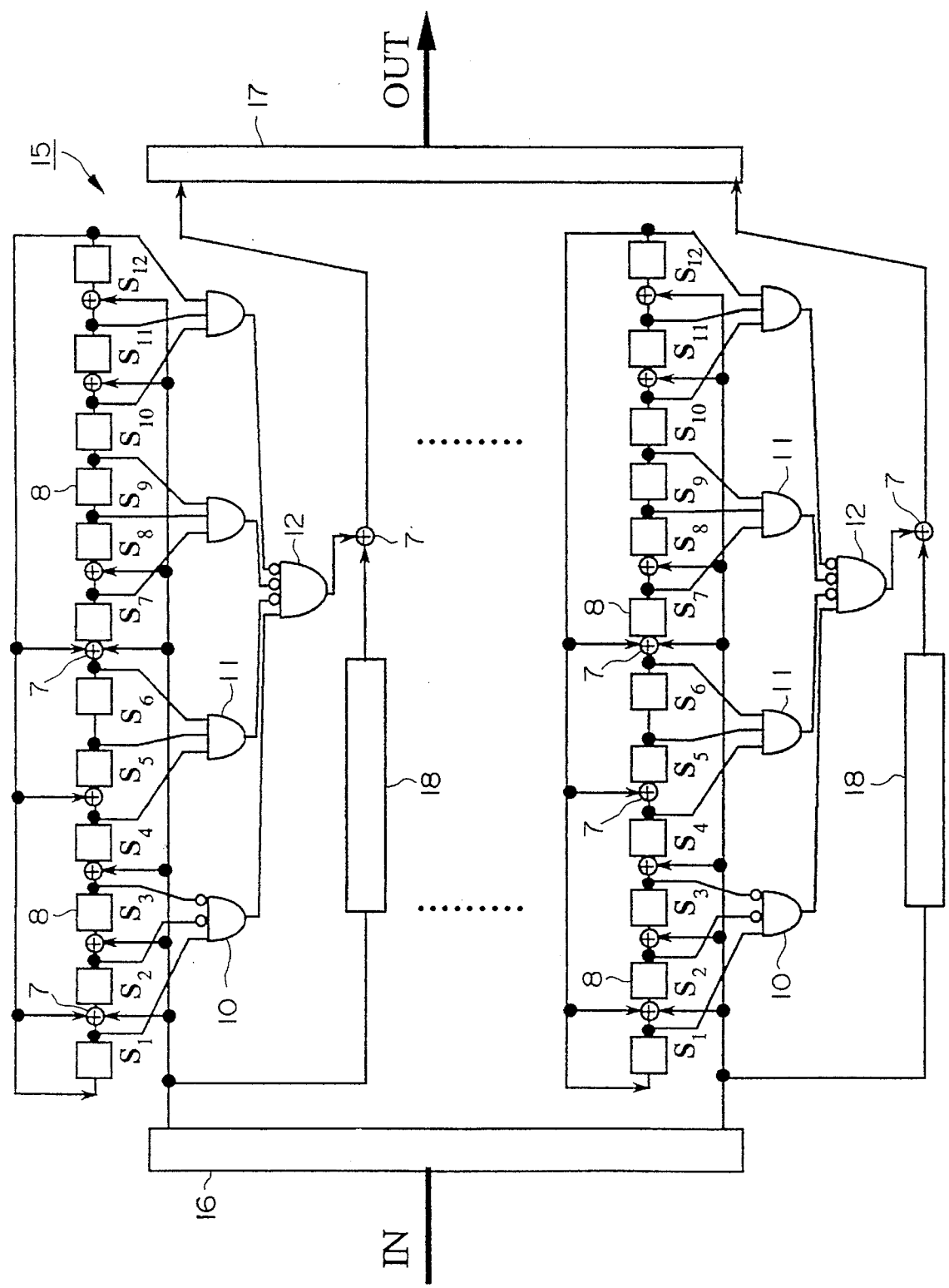
FIG. 16 is a block diagram illustrating an example of a FEC decoding circuit employed by the fifth embodiment.

Fifth embodiment of the present invention will be described with reference to FIGS. 15 and 16. FIG. 15 depicts a coding circuit 14, and FIG. 16 illustrates a decoding circuit 15. In FIGS. 15 and 16, parts equivalent to those of FIGS. 12 and 13 are designated by the same numerals, hence, the description thereof is omitted.

In the fifth embodiment, an AU-4 message is divided into multiple signals in parallel, then coding/decoding operations are performed on each branch (i.e., each parallel signal).

This embodiment corresponds to 8-bit interleaving of AU-4, so an operational clock rate is 19.5 MHz. Each of the coding circuit 14 of FIG. 15 and the decoding circuit 15 of FIG. 16 contains a pair of 1:8 demultiplexer 16 and 8:1 multiplexer 17, and furthermore, there are provided a 1/8 frame buffer 18 in the decoding circuit 15. Since 12 check bits are required for each of the parallel branches, total 12 check bytes are stored in vacant MSOH bytes in the fifth embodiment. Hence, they constitute a (2370,2358) Hamming code to be used in this embodiment. As similar to the first embodiment described before, this embodiment is designed to correct only a single error which occurs in a message, i.e., each branch of AU-4.

Shift registers 8 in the coding circuit 14 in FIG. 15 perform remainder calculations in which a polynomial representative of data stream is divided by $(x^{12}+x^6+x^4+x+1)$ so as to produce check bits P1 to P12. A selector 9 is provided to switch either the message to be passed through or check bits, similar to the first embodiment which includes a check bit writing circuit. The decoding circuit 15 in FIG. 16 is designed such that a polynomial representative of data is multiplied by $(x^{11}+x^{10}+x^7+x^6+x^3+x^2+x)$, divided by $(x^{12}+x^6+x^4+x+1)$ to generate a syndrome S1 to S12. As similar to the aforementioned decoding circuit 5 of FIG. 3, the decoding circuit 15 of FIG. 16 performs error correcting only when a syndrome (10000000000) is generated. The fifth embodiment is designed to enable correction of 8 bit-error, or one byte error, in the message. As for error correcting performance, the fifth embodiment is superior to the first to fourth embodiments, because it is 8 times higher at expense of coding efficiency; it requires so much as 12 check bytes in MSOH. In the fifth embodiment, each of the coding circuit 14 and the decoding circuit 15 includes the shift registers 8, however as described in the first embodiment, it is not necessary to use the shift registers 8.

[F] Sixth Embodiment

Figure 17:
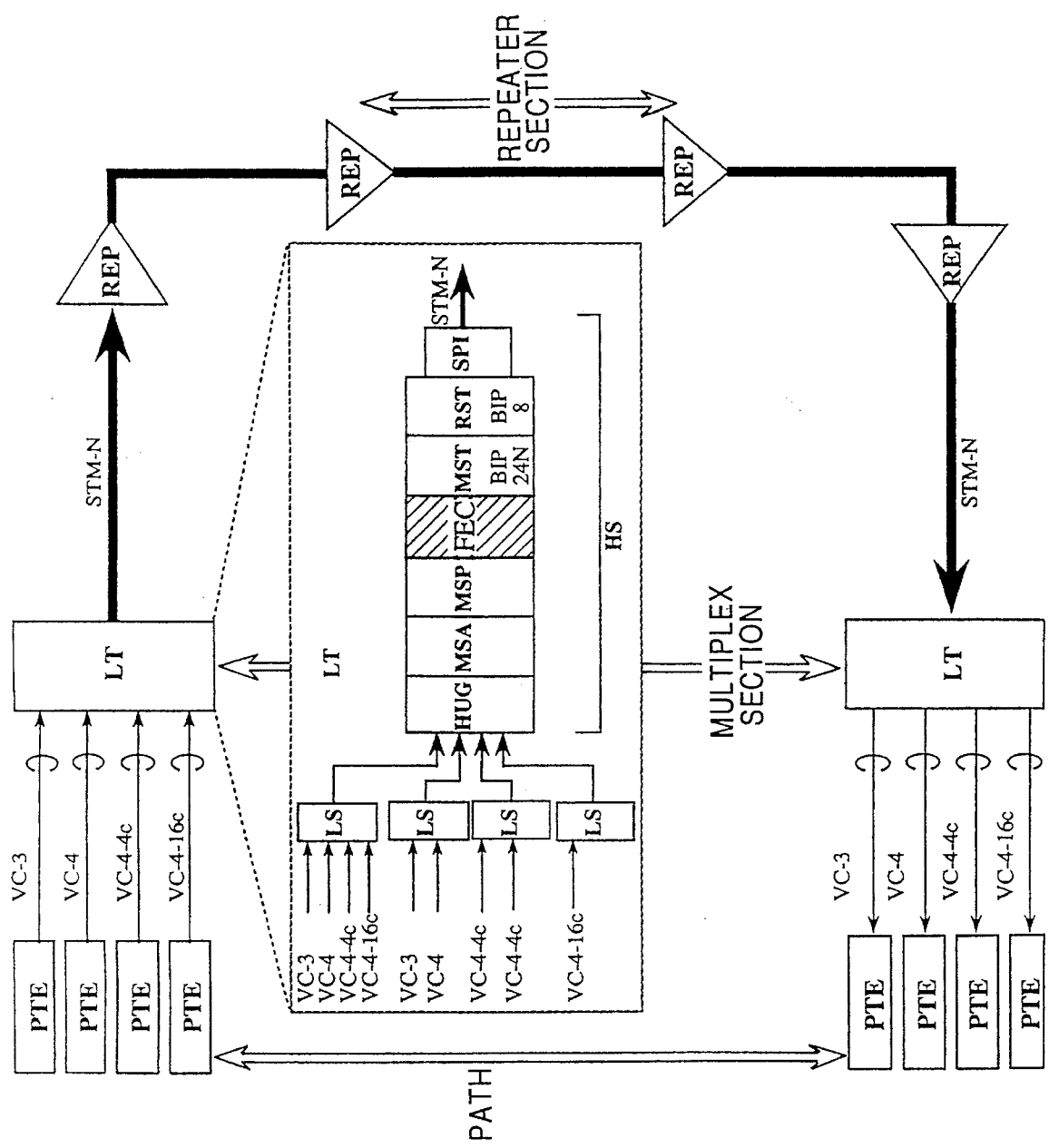
FIG. 17 is a block diagram showing an essential part of an optical transmission system according to a sixth embodiment of the present invention.

Sixth embodiment of the present invention is described. As shown in FIG. 17, a FEC circuit is provided at a LT-MUX where it is located between MSP and MST blocks. This location of the FEC circuit is determined in order to take advantage of an error-correcting effect by switching a transmission line based on corrected BER at the MSP, and to obtain compatibility with non-FEC systems which do not have decoding circuits. Each of blocks in FIG. 17 is defined by CCITT recommendations (i.e., G781, 782, 783). Herein, 'PTE' is a path terminating equipment, 'REP' is a regenerator, 'LS' is a low-speed interface, 'HS' is a high-speed interface, and 'HUG' is a higher-order path un-equipped generation. 'MSA' is a multiplex-section adaption which transfers an AU frame from a high-speed path or vice versa, and it performs assembling/disassembling on AU groups as well, and moreover it executes generation and processing of a pointer. 'SPI' is a SDH physical interface which provides an interface between electrical outputs and physical transmission media, including optical sender (OS) or optical receiver (OR). The MSP block is provided in order to cope with a failure, which occurs in a multiplex section, by switching over a transmission line by a unit of STM-N frame. In the conventional SDH transmission system, automatic-protection switching (APS) protocol uses 'K1' and 'K2' bytes to communicate with MST and to determine whether to switch the transmission line. In contrast, in the present embodiment, MSP is activated by a switching trigger which has passed through the decoding circuit. The MST is a functional block which processes a MSOH field. The MSOH field includes B2, K1, K2, D4 to D12, Z1, Z3 and other undefined bytes, so the MST performs a parity operation (BIP-24N), communication of the APS protocol and processing of data communication channels. RST is a functional block processing a RSOH field including A1, A2 (synchronization), B1 (BIP-8 parity operation), C1 (definition of a degree of multiplexing, STM-N frame), E1 (order wire), F1 (generation/detection of alarms) and D1 to D3 (data communication channels).

In FIG. 17, all of paths can be subjected to mapping in the AU-4 frame. A FEC circuit, processing an AU message which is obtained by excluding SOH from N-demultiplexed STM-N frame (hereafter we call it STM-1 frame), is capable of performing coding/decoding operations with respect to all path speeds.

As for data of STM-N whose transmission-line speed is arbitrarily selected, they are made by multiplexing data of STM-1 frame with additional bytes of STM-N SOH. Thus, the FEC circuit of the present embodiment can be applied to any of the SDH transmission systems, regardless of the transmission-line speed. For an example of VC-4 path in STM-64 system, the VC-4 is transferred to AU-4 at MSA, and after passing through a sending MSP block, a resultant AU-4 is coded at a FEC coder and check bytes are inserted in MSOH. Adding other MSOH bytes in the MST constitutes parallel STM frames each of which is launched to a low-speed port of a STM-64 multiplexer. A FEC-coded frame is byte-multiplexed as a single channel together with non-coded 63 frames in the STM-64 multiplexer. After processing of the RSOH, a resultant STM-64 signal is transmitted onto a fiber line after optical conversion at OS. Transmitted signal is regenerated at OR. A STM-64 receiver processes the RSOH including embedded B1 byte for error correction of BIP-8, and demultiplexing into parallel STM frames. The MST terminates the MSOH including B2 calculation. The FEC-coded frame is transferred to AU-4 and check bits, and the AU-4 is error-corrected at the decoder. Based on corrected BER value, determination is made as to whether the switch in the MSP is activated or not. Thus, VC-4 transmission is completed by pointer processing.

Figure 18A:
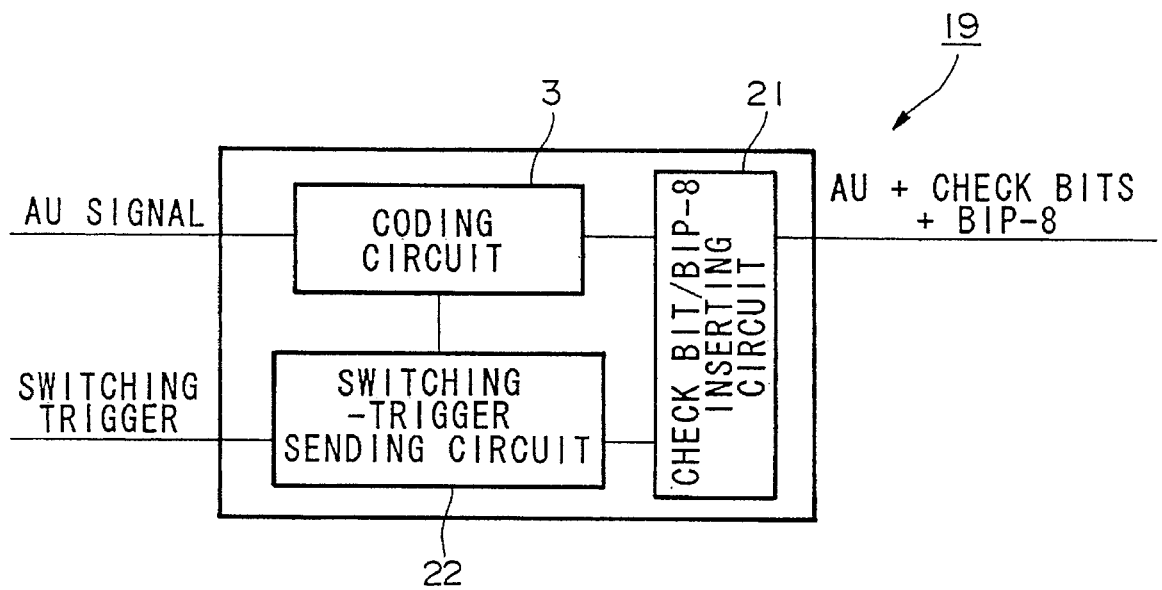
FIG. 18A is a block diagram showing a FEC coding circuit employed by the sixth embodiment.
Figure 18B:
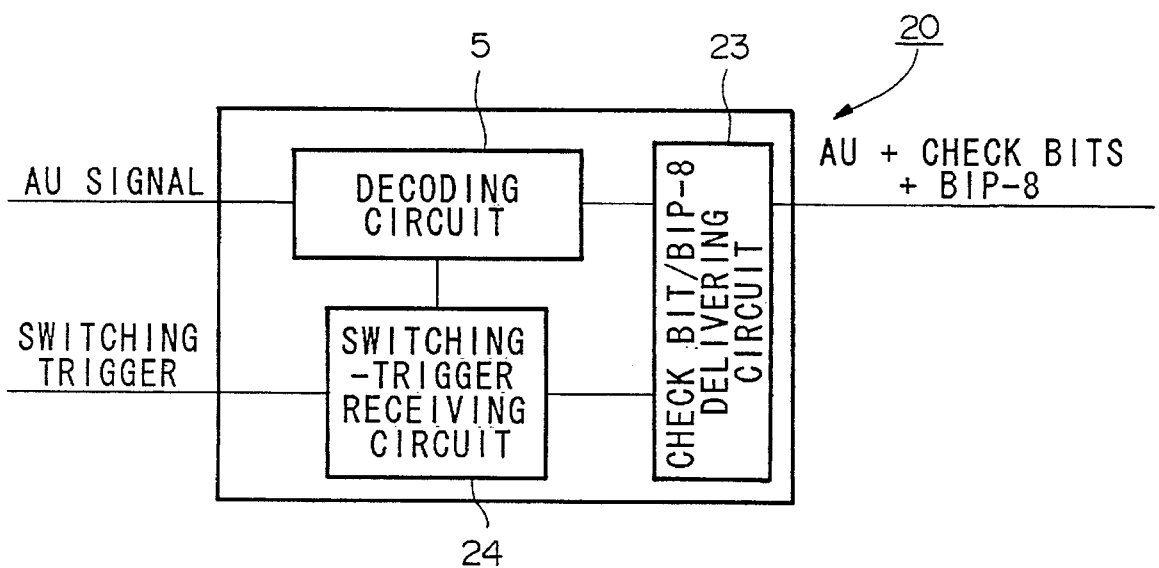
FIG. 18B is a block diagram showing a FEC decoding circuit employed by the sixth embodiment.

FIG. 18A shows an example of a FEC coding circuit 19, while FIG. 18B shows an example of a FEC decoding circuit 20. The FEC coding circuit 19 provides a switching-trigger sending circuit 22, while the FEC decoding circuit 20 has a switching-trigger receiving circuit 24. Each of those circuits 22 and 24 contains a BIP-8 operation functioning kit which monitors BER after error correction. Only one byte is required for BIP-8 operation which can be mapped into the MSOH field. A check-bit/BIP-8 inserting circuit 21 is provided to store check bits and byte of BIP-8 in an un-used MSOH field. A check-bit/BIP-8 delivering circuit 23 extracts the check bits and byte of BIP-8 from the MSOH field together with APS signals. On the other hand, it should be noted that the FEC circuit does not require switching-trigger sending/receiving functions nor the function of BIP-8, when the MST is re-designed to send a trigger with respect to a modified threshold value considering correction capability, i.e., relationship between the input BER and output BER.

[G] Seventh Embodiment

Figure 19:
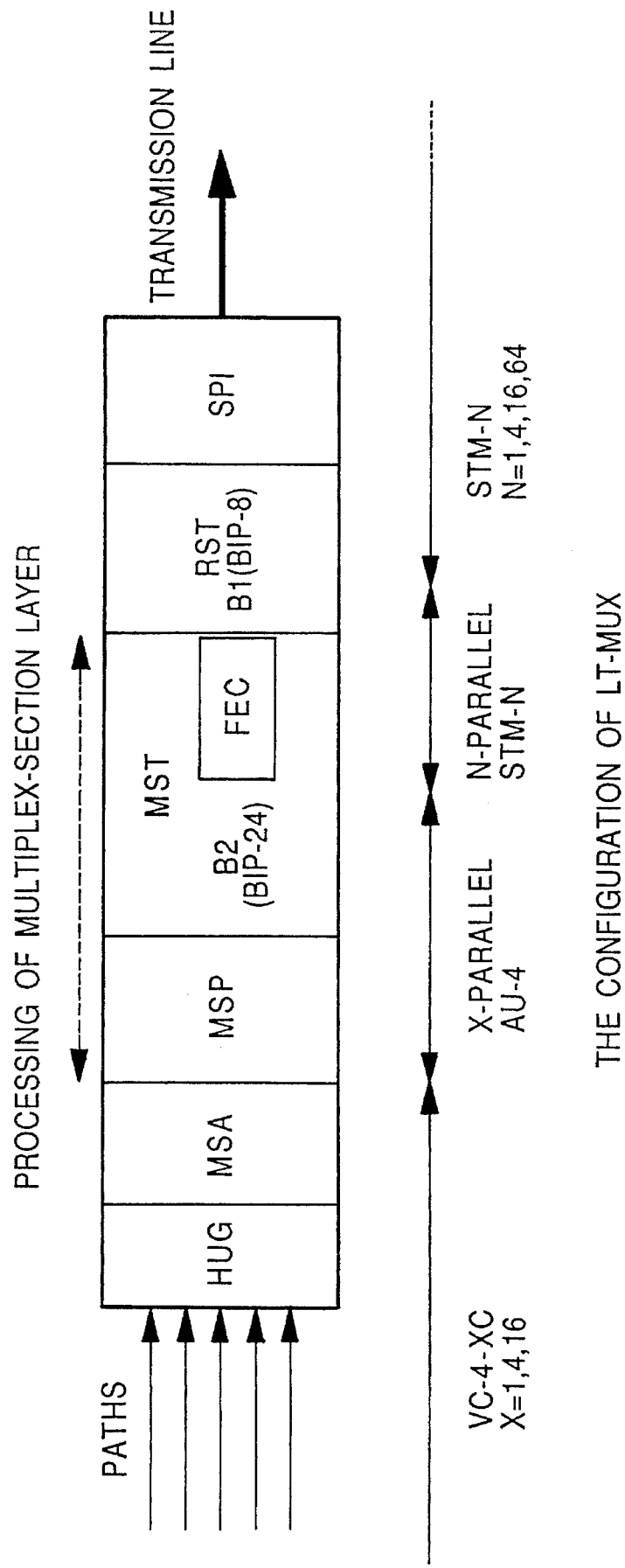
FIG. 19 is a block diagram showing an essential part of an optical transmission system according to a seventh embodiment of the present invention.
Figure 21:
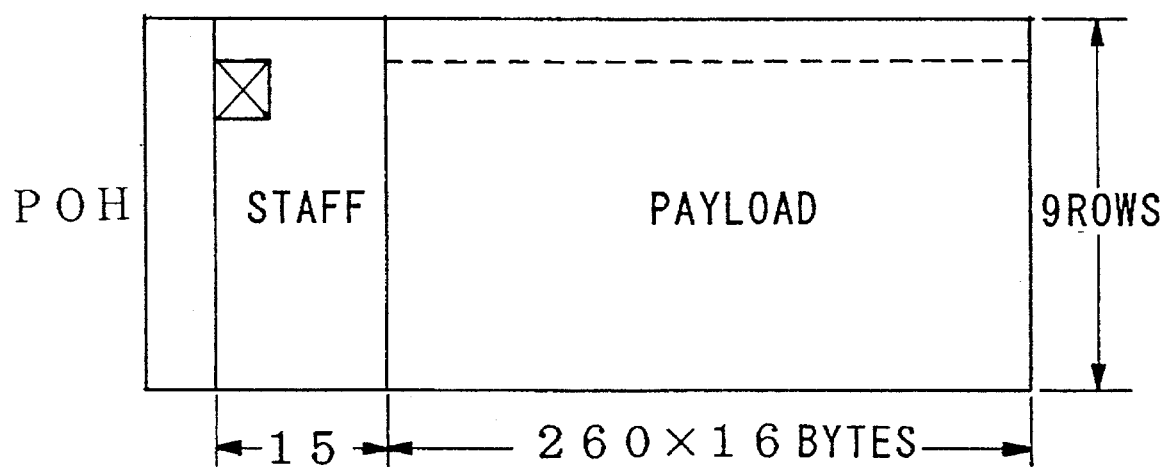
FIG. 21 shows an example of a STM frame in which check bits generated by an error correcting code conventionally known are stored.

Seventh embodiment also includes the case where BIP-24 of MST is performed after error correction. In that case, a FEC circuit is inserted as one optional block in a MST function block as is seen in FIG. 19. There will be an opinion that a transmission line including a FEC circuit should be administrated by a MST block. This leads us to the situation as follows:

At a sending side, BIP-24 calculation is realized without check bytes in a MSOH field but with any other undefined values in those positions, while at a receiver side, check bytes should be excluded and original values of those positions should be rewritten before BIP-24N error detection for consistency of parity check functions.

As described above, each of the all embodiments proposes a cyclic Hamming code which processes the AU-4 in series. The Hamming code has a near optimum coding efficiency. The error correcting code of the first embodiment requires 15 check bits, so only 2 check bytes in the MSOH field. The correction performance is that a signal of BER $5.3 \times 10^{-5}$ which value is equivalent to a single error bit in a frame, can be transmitted in an error free regime.

The error correcting code used by the fifth embodiment is a cyclic Hamming code which processes the 8-parallel of AU-4. The error correcting code of the fifth embodiment requires 12 check bytes in the MSOH field. The correction performance is that a signal of BER $4.3 \times 10^{-4}$ which value is equivalent to a single error byte in a frame, can be transmitted in an error free operation.

FIG. 20A depicts an arrangement of a SOH field in accordance with the first to fifth embodiments, while FIG. 20B illustrates an arrangement of a SOH field in accordance with the fifth embodiment. Each of the arrangements is merely an example, so any vacant bytes can be used to store check bytes. Darkly hatched blocks in FIGS. 20A and 20B are vacant undefined MSOH bytes. A RSOH filed cannot be used by the check bytes because they are processed at every regenerator constituting a regenerator-section layer, which results in processing-delay accumulation.

The coded STM frame of the first to sixth embodiments can be received by a transmission system, which does not provide a decoding circuit, without changing a transmission-line rate thereof. Moreover, every regenerator cannot suffer from any modifications caused by applying the proposed FEC code, because the code is closed in a multiplex-section layer. The coding methods of the embodiments respond all of the path speeds as well as all of the SDH transmission rates. Therefore, the embodiments are superior to the conventional technology which requires a specific circuit for each speed and for each rate. In other words, a set of the coding circuit and decoding circuit are generally applicable to any kinds of SDH transmission systems. Thus, it is possible to reduce developing and manufacturing cost. In addition, the first to fifth embodiments can be selectively used in response to relative property of a transmission system. The error correcting code of the first embodiment is applicable to transmission systems where a number of vacant bytes are limited. The error correcting code of the fifth embodiment is suitable for systems where BER is strictly limited relatively.

Lastly, the circuits and configurations which are applicable to SDH optical transmission systems of the present invention are not limited to those shown by the drawings. As this invention may be embodied in several forms without departing from the spirit or concept of essential characteristics thereof, the present embodiments are therefore illustrative and not restrictive. Since the scope of the invention is defined by the appended claims rather than by the description preceding them, and all changes that fall within meets and bounds of the claims, or equivalence of such meets and bounds are therefore intended to be embraced by the claims.

What is claimed is:

1. A line terminating equipment, applicable to a SDH network, providing a FEC circuit comprising:

first circuit means for processing FEC coding/decoding operations on each of AU-4 signals which are constituted by VC paths or derived from a STM frame corresponding to an input data string; and second circuit means for writing check bits into undefined byte areas of a MSOH field within a SOH field of the STM frame, whereby forward error correcting is performed based on the check bits.

2. A line terminating equipment as defined in claim 1 wherein the input data string is subjected to k-bit interleaving (where $k \geq 1$), so that the first circuit means processes the FEC coding/decoding operations on each of interleaved branches of the AU-4 signals.

3. A line terminating equipment as defined in claim 1 wherein the first circuit means processes division logic in which the AU-4 signals are divided by a specific generator polynomial, and the second circuit means writes remainder bits of the division logic as the check bits.

4. A line terminating equipment as defined in claim 2 wherein the first circuit means processes division logic in which the AU-4 signals are divided by a specific generator polynomial, and the second circuit means writes remainder bits of the division logic as the check bits.

5. A line terminating equipment as defined in claim 2 wherein the FEC circuit is provided between a transmission line and a multiplex-section protection (MSP) block which switches over the transmission line when a failure occurs in a multiplex section, so that a judgement is made as to whether a switch, employed in the MSP block, is activated or not, on the basis of a bit error rate (BER) after error correcting.

6. A line terminating equipment as defined in claim 4 wherein the FEC circuit is provided between a transmission line and a multiplex-section protection (MSP) block which switches over the transmission line when a failure occurs in a multiplex section, so that a judgement is made as to whether a switch, employed in the MSP block, is activated or not, on the basis of a bit error rate (BER) after error correcting.

7. A line terminating equipment as defined in claim 2 wherein the FEC circuit is located between a multiplex-section protection (MSP) block and a multiplex-section termination (MST) block, the MSP block switching over a transmission line when a failure occurs in a multiplex section, the MST block performing a terminating process with respect to the MSOH field, wherein a switch, employed in the MSP block, is activated in response to a BER value after error correction on the basis of the check bits.

8. A line terminating equipment as defined in claim 4 wherein the FEC circuit is located between a multiplex-section protection (MSP) block and a multiplex-section termination (MST) block, the MSP block switching over a transmission line when a failure occurs in a multiplex section, the MST block performing a terminating process with respect to the MSOH field, wherein a switch, employed in the MSP block, is activated in response to a BER value after error correction on the basis of the check bits.

9. A line terminating equipment, applicable to a SDH network, including a FEC circuit comprising:

a serial-parallel conversion circuit for generating n-parallel outputs (where 'n' is an integer larger than 1) from serial input data stream;

a parallel processing circuit for realizing a polynomial-division calculation for 'n' clocks on 'n' data by one clock and for generating check bits or a syndrome; and a check bit writing/reading circuit for adding the check bits to or extracting the check bits from undefined areas of a MSOH field within a SOH field of a STM frame, whereby forward error correcting is performed based on the check bits.

10. A line terminating equipment as defined in claim 9 wherein the parallel processing circuit comprises:

a plurality of exclusive-or circuits; and a plurality of shift registers, each of which takes in and retains input data thereof for one clock and then forwards it to another one, and each of which has an input port connected with one of a first port, a second port and a third port, wherein the first port corresponds to an output port of exclusive-or operations among n-parallel output ports of the serial-parallel conversion circuit, the second port corresponds to an output port of another shift register and the third port corresponds to an output port of exclusive-or calculation performed between the first port and the second port, wherein output ports of the plurality of shift registers are connected with the check bit writing/reading circuit.

11. A FEC processing circuit, which is provided in a FEC circuit in a line terminating equipment, comprising:

a serial-parallel conversion circuit for generating n-parallel outputs (where 'n' is an integer larger than 1) from serial input data stream;

a parallel processing circuit for realizing a polynomial-division calculation for 'n' clocks on 'n' data by one clock and for generating check bits or a syndrome; and a check bit writing/reading circuit for adding the check bits to or extracting the check bits from a transmitting data stream.

12. A FEC processing circuit as defined in claim 11 wherein the parallel processing circuit comprises:

a plurality of exclusive-or circuits; and a plurality of shift registers, each of which takes in and retains input data thereof for one clock and then forwards it to another one, and each of which has an input port connected with one of a first port, a second port and a third port, wherein the first port corresponds to an output port of exclusive-or operations among n-parallel output ports of the serial-parallel conversion circuit, the second port corresponds to an output port of another shift register and the third port corresponds to an output port of exclusive-or calculation performed between the first port and the second port, wherein output ports of the plurality of shift registers are connected with the check bit writing/reading circuit.

13. A FEC processing circuit as defined in claim 11 wherein the parallel processing circuit comprises an electrical connection which is determined by the steps of:

making a matrix expressing one clock progressing, wherein an input vector is a concatenation of n-sequences of incoming data stream and initial values of shift registers and an output vector consists of values of the shift registers at one clock progressing, so that a $(m+n) \times m$ dimensional matrix is created in which 'm' is a number of the shift registers determined uniquely by a generator polynomial;

shifting column vectors of an initial matrix leftward $(n-1)$ times with generating new $(n-1)$ column vectors at a right-hand side where each of the new $(n-1)$ column vectors generated is obtained by circulation of elements of a last column vector of the initial matrix, thus yielding a n-clock-progressing matrix;

calculating an output vector of the n-clock-progressing matrix from the input vector; and connecting the shift registers and exclusive-ors on the basis of the output vector calculated so as to generate shift register values for a n-clock logic in a single clock.

* * * * *